(12) United States Patent
Shin et al.

(10) Patent No.: US 11,877,451 B2
(45) Date of Patent: Jan. 16, 2024

(54) VERTICAL MEMORY DEVICES

(71) Applicant: Samsung Electronics Co., Ltd., Suwon-si (KR)

(72) Inventors: Jaehoon Shin, Suwon-si (KR); Kangmin Kim, Hwaseong-si (KR); Kyeongjin Park, Yongin-si (KR); Seungmin Song, Hwaseong-si (KR); Joongshik Shin, Yongin-si (KR); Geunwon Lim, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 290 days.

(21) Appl. No.: 17/162,408

(22) Filed: Jan. 29, 2021

(65) Prior Publication Data
US 2021/0320125 A1    Oct. 14, 2021

(30) Foreign Application Priority Data

Apr. 8, 2020 (KR) .......................... 10-2020-0042762

(51) Int. Cl.
*H10B 43/27* (2023.01)
*H01L 23/522* (2006.01)
(Continued)

(52) U.S. Cl.
CPC ......... *H10B 43/27* (2023.02); *H01L 23/5226* (2013.01); *H10B 41/10* (2023.02);
(Continued)

(58) Field of Classification Search
CPC ........ H10B 43/27; H10B 41/27; H10B 41/10; H10B 43/10; H10B 41/40; H10B 43/40;
(Continued)

(56) References Cited

U.S. PATENT DOCUMENTS 7,843,733 B2    11/2010  Kim et al.
9,064,801 B1 *  6/2015   Horak ............... H01L 21/76834
(Continued)

FOREIGN PATENT DOCUMENTS

CN    110024126 A    7/2019
KR    100909968 B1   7/2009

*Primary Examiner* — Mark W Tornow
*Assistant Examiner* — David Paul Sedorook
(74) *Attorney, Agent, or Firm* — Harness, Dickey & Pierce, P.L.C.

(57) ABSTRACT

A vertical memory device includes a gate electrode structure, a channel, an insulation pattern structure, an etch stop structure, and a through via. The gate electrode structure includes gate electrodes spaced apart from each other on a substrate in a first direction perpendicular to an upper surface of the substrate, and each of the gate electrodes extends in a second direction parallel to the upper surface of the substrate. The channel extends in the first direction through the gate electrode structure. The insulation pattern structure extends through the gate electrode structure. The etch stop structure extends through the gate electrode structure and surround at least a portion of a sidewall of the insulation pattern structure, and the etch stop structure includes a filling pattern and an etch stop pattern on a sidewall of the filling pattern. The through via extends in the first direction through the insulation pattern structure.

18 Claims, 43 Drawing Sheets

(51) Int. Cl.
*H10B 41/10* (2023.01)
*H10B 41/27* (2023.01)
*H10B 41/40* (2023.01)
*H10B 43/10* (2023.01)
*H10B 43/40* (2023.01)

(52) U.S. Cl.
CPC ............ *H10B 41/27* (2023.02); *H10B 41/40* (2023.02); *H10B 43/10* (2023.02); *H10B 43/40* (2023.02)

(58) Field of Classification Search
CPC ........ H10B 43/50; H10B 41/35; H10B 43/35; H01L 23/5226; H01L 21/76897; H01L 21/76895; H01L 23/5386
See application file for complete search history.

(56) References Cited

U.S. PATENT DOCUMENTS

| | | | |
|---|---|---|---|
| 9,299,716 B2 | 3/2016 | Hwang et al. | |
| 9,508,730 B2 | 11/2016 | Lee et al. | |
| 9,530,789 B2 | 12/2016 | Lee et al. | |
| 9,837,433 B2 | 12/2017 | Oh et al. | |
| 9,837,436 B2 | 12/2017 | Lee et al. | |
| RE46,994 E | 8/2018 | Kim et al. | |
| 10,062,764 B1* | 8/2018 | Wu | H01L 21/32139 |
| 2006/0084275 A1* | 4/2006 | You | H01L 21/31116 |
| | | | 257/E21.252 |
| 2013/0075823 A1* | 3/2013 | Yu | H01L 21/7682 |
| | | | 257/E27.059 |
| 2019/0139979 A1* | 5/2019 | Kanamori | H10B 43/35 |
| 2019/0287990 A1 | 9/2019 | Sugisaki | |
| 2019/0386018 A1 | 12/2019 | Watanabe et al. | |
| 2020/0027893 A1* | 1/2020 | Yang | H01L 21/76831 |

\* cited by examiner

VERTICAL MEMORY DEVICES

CROSS-REFERENCE TO RELATED APPLICATIONS

This application claims priority under 35 USC § 119 to Korean Patent Application No. 10-2020-0042762, filed on Apr. 8, 2020 in the Korean Intellectual Property Office (KIPO), the contents of which are herein incorporated by reference in their entirety.

BACKGROUND

1. Field

The inventive concepts relate to a vertical memory device.

2. Description of the Related Art

In a VNAND flash memory device having a cell-over-periphery (COP) structure, a through via extending through gate electrodes to be electrically connected to a lower circuit pattern may be formed after forming an insulation pattern structure at an area of the gate electrodes to extend through the insulation pattern structure so as not to be electrically connected to the gate electrodes.

SUMMARY

Example embodiments provide a method of forming an insulation pattern structure at a desired area.

Example embodiments provide a vertical memory device having improved characteristics.

According to an aspect of the inventive concepts, there is provided a vertical memory device. The vertical memory device may include a gate electrode structure, a channel, an insulation pattern structure, an etch stop structure, and a through via. The gate electrode structure may include gate electrodes spaced apart from each other on a substrate in a first direction substantially perpendicular to an upper surface of the substrate, and each of the gate electrodes may extend in a second direction substantially parallel to the upper surface of the substrate. The channel may extend in the first direction through the gate electrode structure. The insulation pattern structure may extend through the gate electrode structure. The etch stop structure may extend through the gate electrode structure and surround at least a portion of a sidewall of the insulation pattern structure, and the etch stop structure may include a filling pattern and an etch stop pattern on a sidewall of the filling pattern. The through via may extend in the first direction through the insulation pattern structure.

According to an aspect of the inventive concepts, there is provided a vertical memory device. The vertical memory device may include a gate electrode structure, a channel, an etch stop structure, an insulation pattern structure, and a through via. The gate electrode structure may include gate electrodes spaced apart from each other on a substrate in a first direction substantially perpendicular to an upper surface of the substrate, and each of the gate electrodes may extend in a second direction substantially parallel to the upper surface of the substrate. The channel may extend in the first direction through the gate electrode structure. The etch stop structure may extend in the first direction through the gate electrode structure, and the etch stop structure may have a closed ring shape in a plan view and include a plurality of patterns containing different materials from each other. The insulation pattern structure may be surrounded by the etch stop structure. The through via may extend in the first direction through the insulation pattern structure.

According to an aspect of the inventive concepts, there is provided a vertical memory device. The vertical memory device may include a gate electrode structure, a channel, an insulation pattern structure, an etch stop structure, a through via, a first division pattern, second division patterns, and a support layer. The gate electrode structure may include gate electrodes spaced apart from each other on a substrate in a first direction substantially perpendicular to an upper surface of the substrate, and each of the gate electrodes may extend in a second direction substantially parallel to the upper surface of the substrate. The channel may extend in the first direction through the gate electrode structure. The insulation pattern structure may extend through the gate electrode structure. The etch stop structure may extend through the gate electrode structure and surround at least a portion of a sidewall of the insulation pattern structure. The through via may extend in the first direction through the insulation pattern structure. The first division pattern may be formed at each of opposite sides of the gate electrode structure in a third direction substantially parallel to the upper surface of the substrate and crossing the second direction, and each of the first division pattern may extend in the second direction. The second division patterns may be spaced apart from each other in the second direction between the first division patterns, and each of the second division patterns may extend through the gate electrode structure. The support layer may cover an upper surface of the etch stop structure and contact an upper sidewall of each of the first and second division patterns. Each of the first division patterns may be spaced apart from the etch stop structure in the third direction, and each of the second division patterns may be spaced apart from the etch stop structure in the second direction.

According to an aspect of the inventive concepts, there is provided a vertical memory device. The vertical memory device may include a lower circuit pattern, a common source plate (CSP), a gate electrode structure, channels, a charge storage structure, an insulation pattern structure, an etch stop structure, a through via, a first division pattern, second division patterns, and a support layer. The lower circuit pattern may be formed on a substrate including a cell array region and a pad region at least partially surrounding the cell array region. The CSP may be formed on the lower circuit pattern. The gate electrode structure may include gate electrodes spaced apart from each other on the CSP in a first direction substantially perpendicular to an upper surface of the substrate. Each of the gate electrodes may extend on the cell array region and the pad region of the substrate in a second direction substantially parallel to the upper surface of the substrate, and the gate electrodes may be stacked in a staircase shape on the pad region of the substrate. Each of the channels may extend in the first direction through the gate electrode structure on the CSP on the cell array region of the substrate. The charge storage structure may be formed on a sidewall of each of the channels. The insulation pattern structure may extend through the gate electrode structure on the pad region of the substrate. The etch stop structure may extend through the gate electrode structure and surround at least a portion of a sidewall of the insulation pattern structure. The through via may extend in the first direction through the insulation pattern structure and the CSP, and may be electrically connected to the lower circuit pattern. The first division pattern may be formed at each of opposite sides of the gate electrode structure in a third direction substantially parallel to the upper surface of the substrate and crossing the second direction, and each of the first division pattern may extend in the second direction on the cell array region and the pad region of the substrate. The second division patterns may be spaced apart from each other in the second direction, and each of the second division patterns may extend through the gate electrode structure between the first division patterns. The support layer may cover an upper surface of the etch stop structure and contact an upper sidewall of each of the first and second division patterns. Each of the first division patterns may be spaced apart from the etch stop structure in the third direction, and each of the second division patterns may be spaced apart from the etch stop structure in the second direction.

The vertical memory device in accordance with example embodiments may not lean or fall down during the manufacturing process and/or electrical short may not be generated in lower and/or upper gate electrodes in the gate electrode structure.

DETAILED DESCRIPTION

The above and other aspects and features of the vertical memory devices and the methods of manufacturing the same in accordance with example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

Hereinafter in the specifications (not necessarily in the claims), a direction substantially perpendicular to an upper surface of a substrate may be defined as a first direction D1, and two directions substantially parallel to the upper surface of the substrate and crossing each other may be defined as second and third directions D2 and D3, respectively. In example embodiments, the second and third directions D2 and D3 may be substantially perpendicular to each other.

FIGS. 1 to 33 are plan views and cross-sectional views illustrating a method of manufacturing a vertical memory device in accordance with example embodiments. Particularly, FIGS. 1-2, 6, 8, 15, 19, 24, 27 and 29 are the plan views, and FIGS. 3-5, 7, 9-14, 16-18, 20-23, 25-26, 28 and 30-33 are the cross-sectional views.

FIGS. 3-5, 7, 28 and 30-31 are cross-sectional views taken along lines A-A' of corresponding plan views, respectively, FIGS. 9, 11-13, 16, 18A, 20, 22, 25 and 32 are cross-sectional views taken along lines B-B' of corresponding plan views, respectively, and FIGS. 10, 14, 17, 18B, 21, 23, 26 and 33 are cross-sectional views taken along lines C-C' of corresponding plan views, respectively. FIGS. 2 to 33 are drawings of a region X of FIG. 1, FIG. 7B is an enlarged cross-sectional view of a region Y of FIG. 7A, and FIGS. 28B and 30B are enlarged cross-sectional views of regions Z of FIGS. 28A and 30A, respectively.

Figure 1:
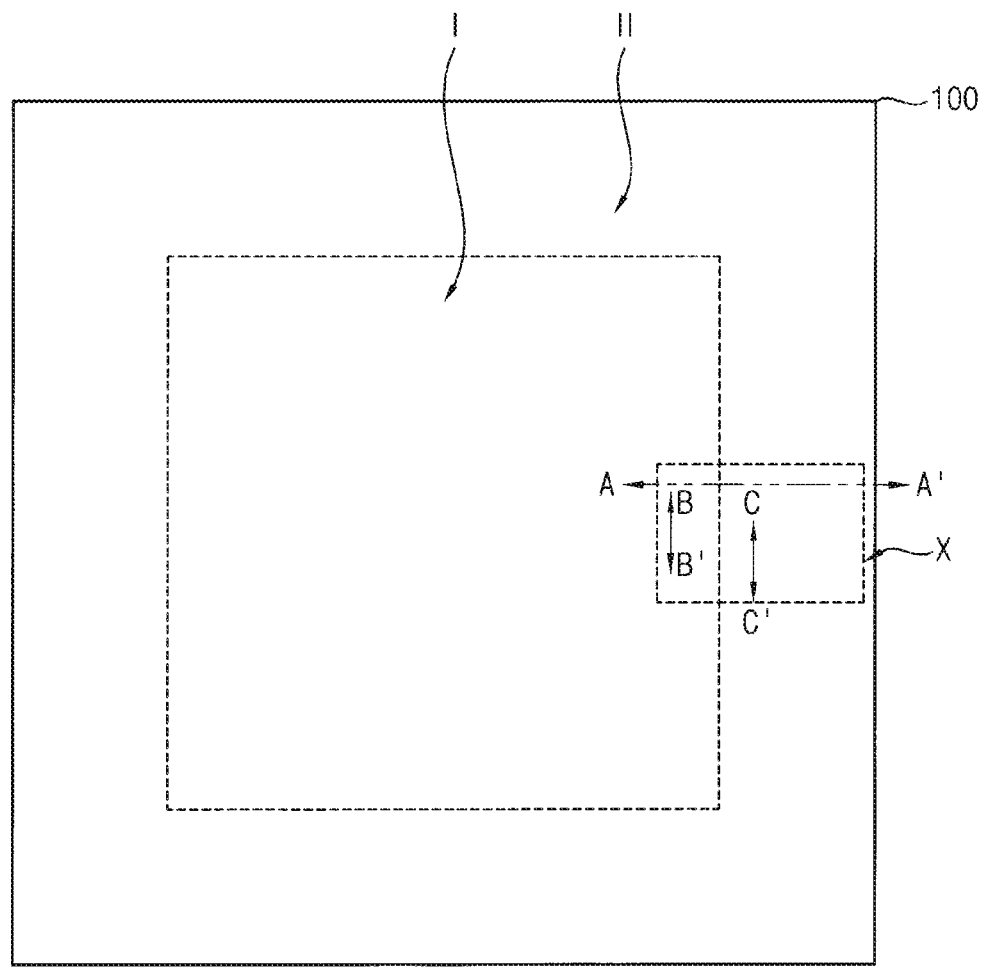
FIGS. 1 to 33 are plan views and cross-sectional views illustrating a method of manufacturing a vertical memory device in accordance with example embodiments.
Figure 1:
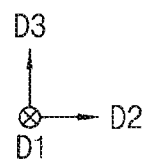

Referring to FIG. 1, a substrate 100 may include a first region I and a second region II at least partially surround the first region I.

The substrate 100 may include silicon, germanium, silicon-germanium or a III-V compound such as GaP, GaAs, GaSb, etc. In some example embodiments, the substrate 10 may be a silicon-on-insulator (SOI) substrate or a germanium-on-insulator (GOI) substrate.

In example embodiments, the first and second regions I and II of the substrate 100 may be a cell array region and a pad region (or an extension region), respectively, both of which together may form a cell region. That is, memory cells each of which may include a gate electrode, a channel, and a charge storage structure may be formed on the first region I of the substrate 100, and upper contact plugs for transferring electrical signals to the memory cells and pads contacting the upper contact plugs may be formed on the second region II of the substrate 100. In the drawings, the second region II of the substrate 100 entirely surrounds the first region I of the substrate 100, however, the inventive concepts may not be limited thereto. For example, the second region II of the substrate 100 may be formed at each of opposite sides of the first region I of the substrate 100 in the second direction D2.

A third region (not shown) may be further formed to surround the second region II of the substrate 100, and an upper circuit pattern may be formed to transfer electrical signals to the memory cells through the upper contact plugs.

Hereinafter, the region X including portions of the first and second regions I and II of the substrate 100 will be explained.

Figure 2:
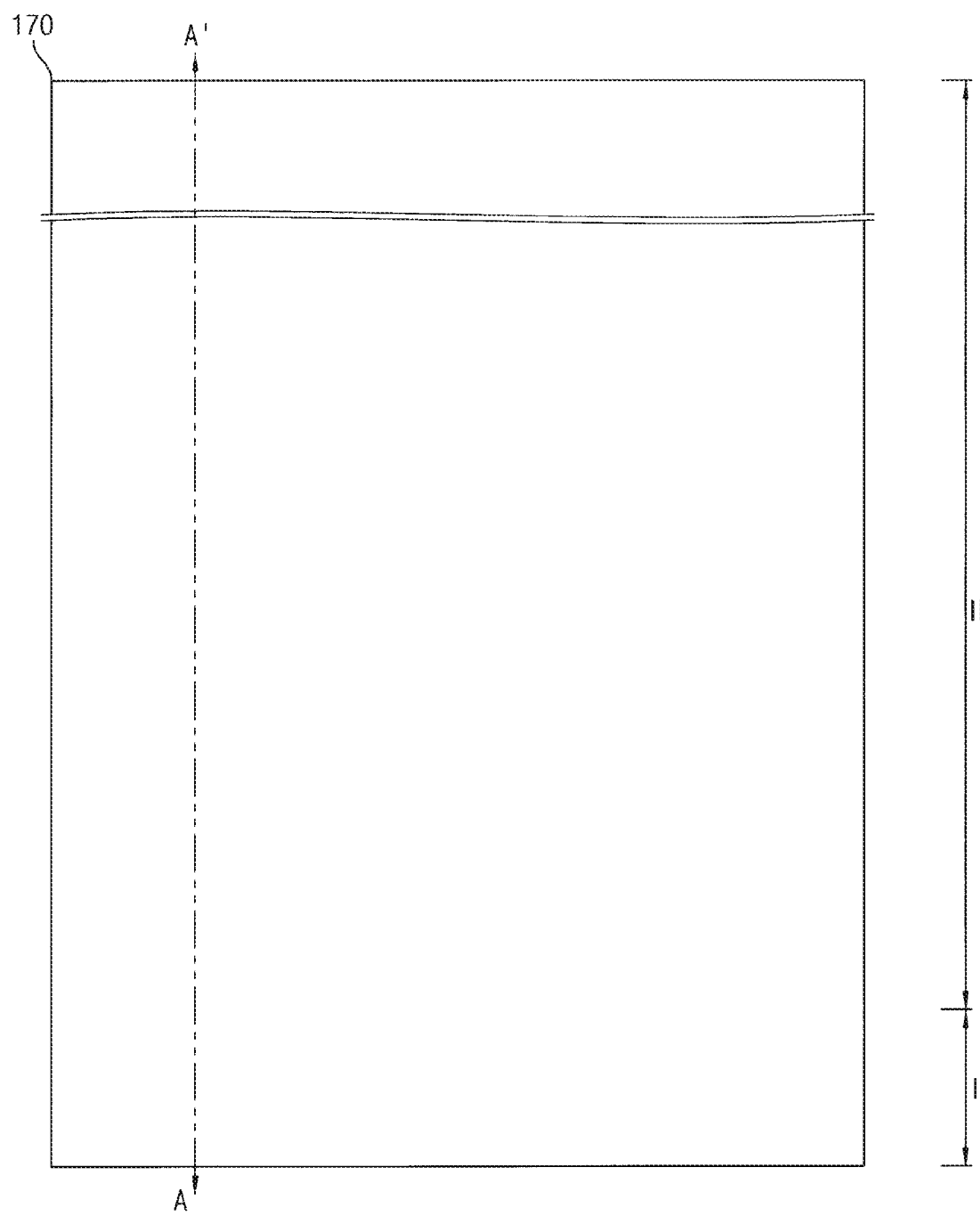
Figure 2:
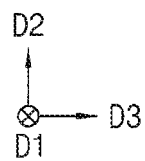
Figure 3:
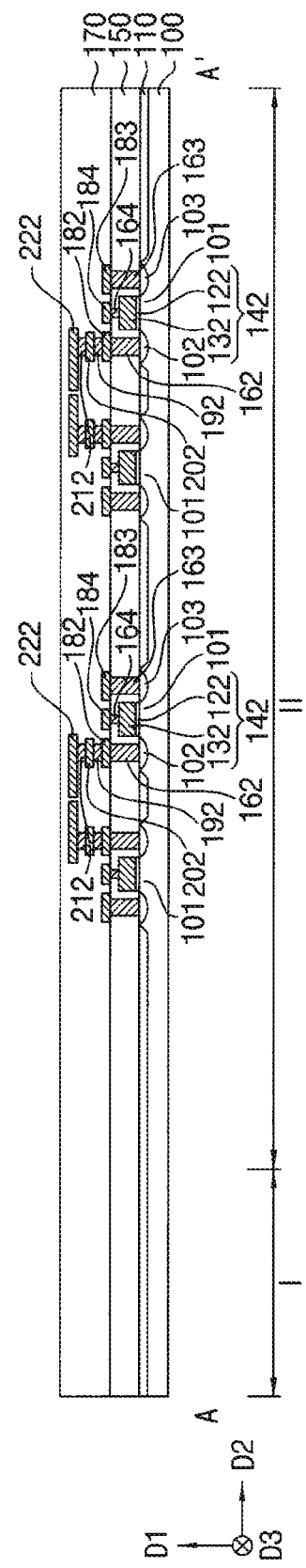

Referring to FIGS. 2 and 3, a lower circuit pattern may be formed on the substrate 100, and first and second insulating interlayers 150 and 170 may be sequentially formed on the substrate 100 to cover the lower circuit pattern.

The substrate 100 may include a field region on which an isolation pattern 110 is formed, and an active region on which no isolation pattern 110 is formed. The isolation pattern 110 may be formed by, e.g., a shallow trench isolation (STI) process, and may include an oxide, e.g., silicon oxide.

In example embodiments, the vertical memory device may have a COP structure. That is, the lower circuit pattern may be formed on the substrate 100, and memory cells, upper contact plugs, and an upper circuit pattern may be formed over the lower circuit pattern.

The lower circuit pattern may include, e.g., transistors, lower contact plugs, lower wirings, lower vias, etc.

Figure 9:
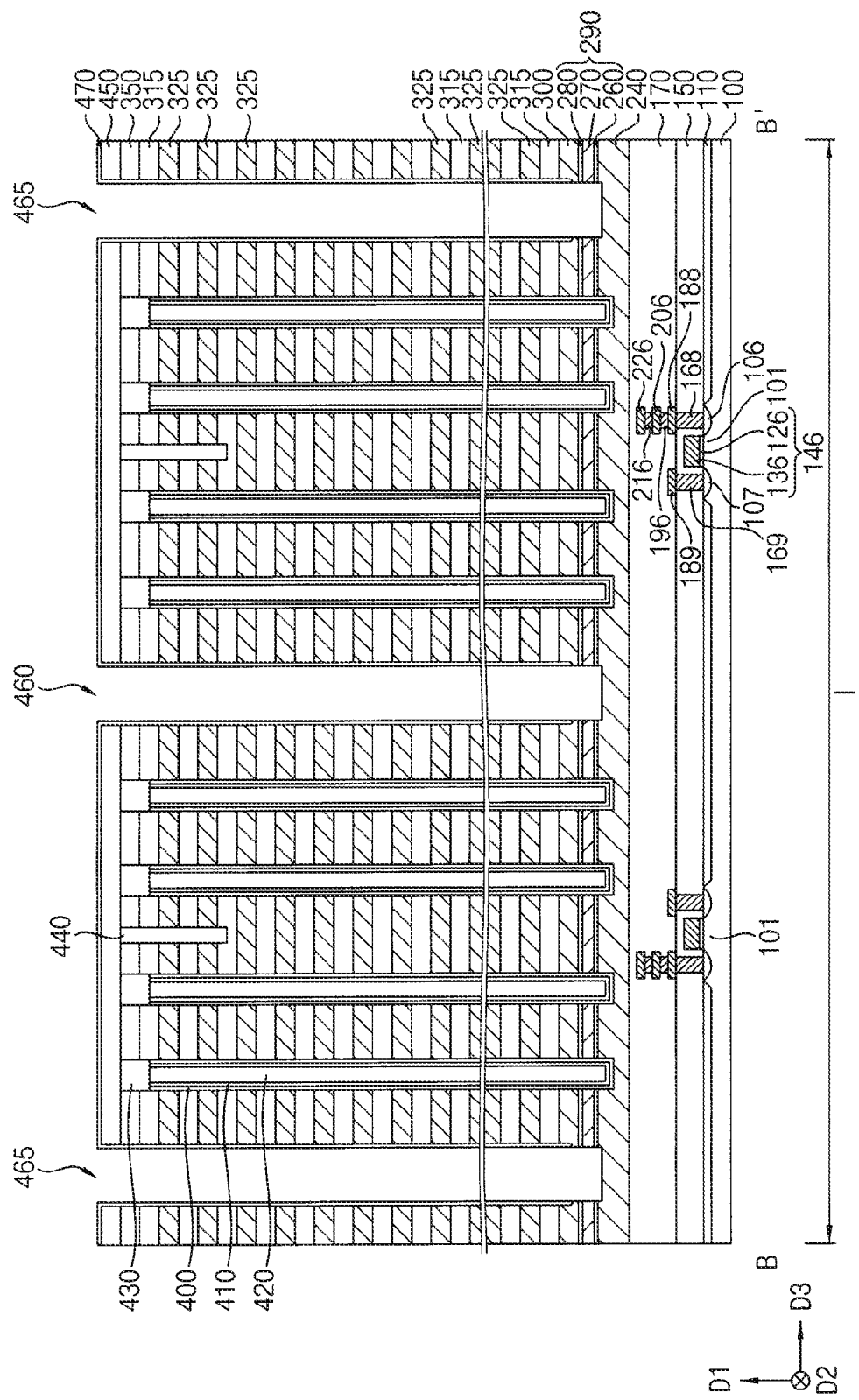

Referring to FIG. 9, first and second transistors may be formed on the second and first regions II and I, respectively, of the substrate 100. The first transistor may include a first lower gate electrode 142 on the substrate 100 and first and second impurity regions 102 and 103 serving as source/drain at upper portions of the active region 101 adjacent to the first lower gate electrode 142. The second transistor may include a second lower gate electrode 146 on the substrate 100 and third and fourth impurity regions 106 and 107 serving as source/drain at upper portions of the active region 101 adjacent to the second lower gate electrode 146.

The first lower gate structure 142 may include a first lower gate insulation pattern 122 and a first lower gate electrode 132 sequentially stacked on the substrate 100, and the second lower gate electrode 146 may include a second lower gate insulation pattern 126 and a second lower gate electrode 136 sequentially stacked.

The first insulating interlayer 150 may be formed on the substrate 100 to cover the first and second transistors. First, second, fourth and fifth lower contact plugs 162, 163, 168 and 169 may extend through the first insulating interlayer 150 to contact the first to fourth impurity regions 102, 103, 106 and 107, respectively, and a third lower contact plug 164 may extend through the first insulating interlayer 150 to contact the first lower gate electrode 132. A sixth lower contact plug (not shown) may be further formed to extend through the first insulating interlayer 150 to contact the second lower gate electrode 136.

First to fifth lower wirings 182, 183, 184, 188 and 189 may be formed on the first insulating interlayer 150 to contact upper surfaces of the first to fifth lower contact plugs 162, 163, 164, 168 and 169, respectively. A first lower via 192, a sixth lower wiring 202, a third lower via 212 and an eighth lower wiring 222 may be sequentially stacked on the first lower wiring 182, and a second lower via 196, a seventh lower wiring 206, a fourth lower via 216 and a ninth lower wiring 226 may be sequentially stacked on the fourth lower wiring 188.

The second insulating interlayer 170 may be formed on the first insulating interlayer 150 to cover the first to ninth lower wirings 182, 183, 184, 188, 189, 202, 206, 222 and 226 and the first to fourth lower via 192, 196, 212 and 216.

The elements of the lower circuit pattern may be formed by a patterning process or a damascene process.

Figure 4:
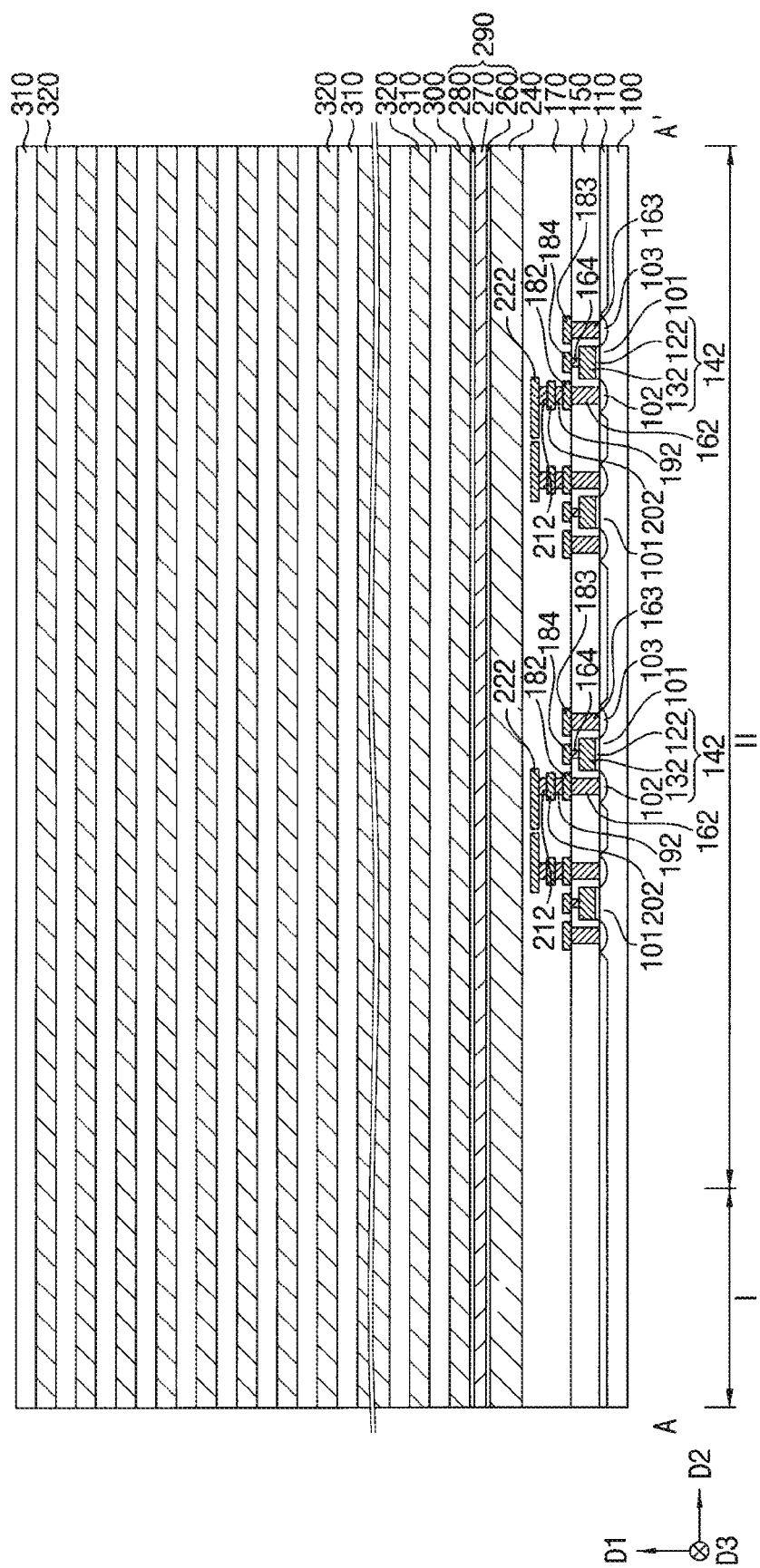

Referring to FIG. 4, a common source plate (CSP) 240, a first sacrificial layer structure 290, and a first support layer 300 may be sequentially formed on the second insulating interlayer 170.

The CSP 240 may include, e.g., polysilicon doped with n-type impurities. Alternatively, the CSP 240 may include a metal silicide layer and a polysilicon layer doped with n-type impurities sequentially stacked. The metal silicide layer may include, e.g., tungsten silicide.

The first sacrificial layer structure 290 may include first to third sacrificial layers 260, 270 and 280 sequentially stacked. Each of the first and third sacrificial layers 260 and 280 may include an oxide, e.g., silicon oxide, and the second sacrificial layer 270 may include a nitride, e.g., silicon nitride.

The first support layer 300 may include a material having an etching selectivity with respect to the first to third sacrificial layers 260, 270 and 280, e.g., polysilicon doped with n-type impurities. In some example embodiments, the first support layer 300 may extend through the first sacrificial layer structure 290 to contact an upper surface of the CSP 240, which may form a support pattern (not shown).

An insulation layer 310 and a fourth sacrificial layer 320 may be alternately and repeatedly formed on the first support layer 300, and thus a mold layer including the insulation layers 310 and the fourth sacrificial layers 320 may be formed. The insulation layer 310 may include an oxide, e.g., silicon oxide, and the fourth sacrificial layer 320 may include a material having an etching selectivity with respect to the insulation layer 310, e.g., a nitride such as silicon nitride.

Figure 6:
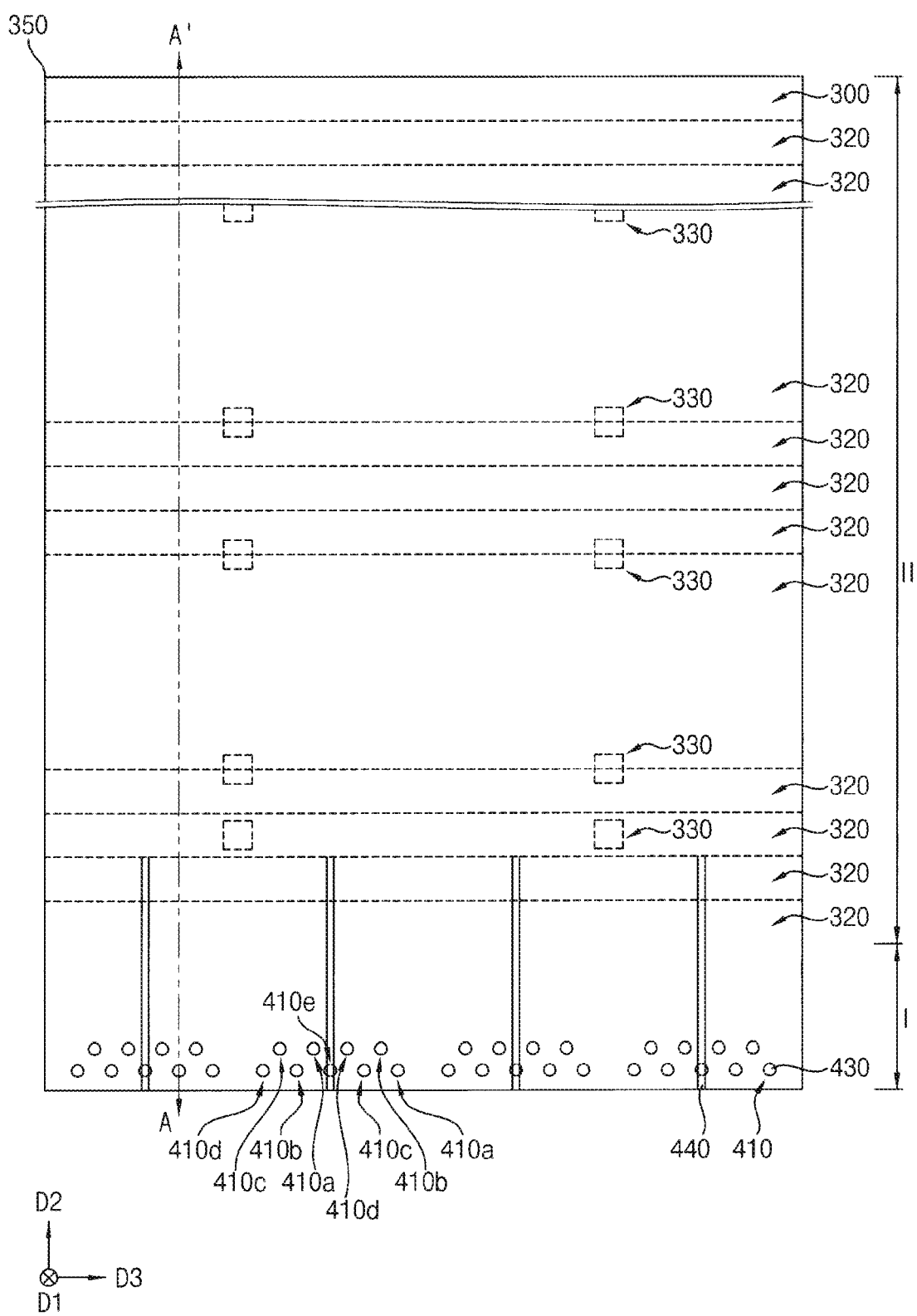

However, referring to FIG. 6, a first division pattern 330 may be formed through a lowermost one of the fourth sacrificial layers 320. The first division pattern 330 may be formed on the second region II of the substrate 100, and may include an oxide, e.g., silicon oxide. In example embodiments, a plurality of first division patterns 330 may be formed in each of the second and third division patterns D2 and D3.

Figure 5:
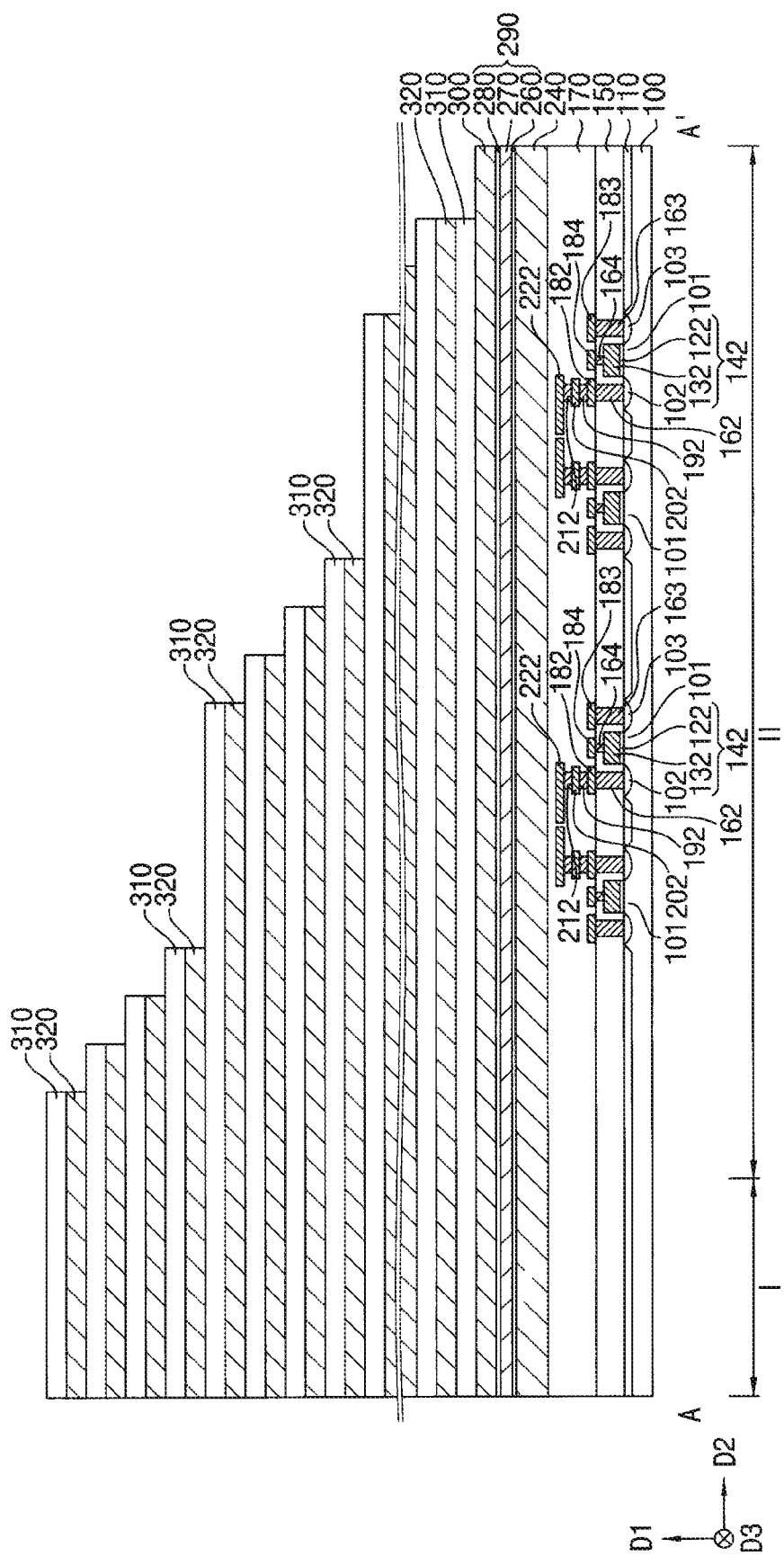

Referring to FIG. 5, after forming a photoresist pattern on an uppermost one of the insulation layers 310, the uppermost one of the insulation layers 310 and an uppermost one of the fourth sacrificial layers 320 may be etched using the photoresist pattern as an etching mask. Thus, one of the insulation layers 310 under the uppermost one of the fourth sacrificial layers 320 may be partially exposed.

A trimming process for reducing an area of the photoresist pattern may be performed, and the uppermost one of the insulation layers 310, the uppermost one of the fourth sacrificial layers 320, the partially exposed one of the insulation layers 310, and one of the fourth sacrificial layers 320 thereunder may be etched using the reduced photoresist pattern as an etching mask. The trimming process and the etching process may be alternately and repeatedly performed to form a mold having a plurality of step layers each including the fourth sacrificial layer 320 and the insulation layer 310 sequentially stacked and having a staircase shape.

Hereinafter, the "step layer" may be referred to an entire portion of the fourth sacrificial layer 320 and the insulation layer 310 at the respective same level including an exposed portion and non-exposed portion, and the exposed portion of the step layer that may be covered by upper step layers to be exposed may be defined as a "step." In example embodiments, a plurality of steps may be arranged in the second direction D2. Alternatively, a plurality of steps may be also arranged in the third direction D3.

In example embodiments, lengths in the second direction D2 of the steps of the mold may be constant except for some steps. The steps having different lengths in the second direction D2 may be longer than other steps in the second direction D2. Hereinafter, ones of the steps having a relatively short length in the second direction D2 may be referred to as a first steps, and other ones of the steps having a relatively long length in the second direction D2 may be referred to as a second steps. FIG. 5 shows two second steps. In each plan view after FIG. 6, the steps are indicated by dotted lines.

The mold may be formed on the first support layer 300 on the first and second regions I and II of the substrate 100, and an end portion of the first support layer 300 may not be covered by the mold but exposed. Each step of the mold may be formed on the second region II of the substrate 100.

Figure 7A:
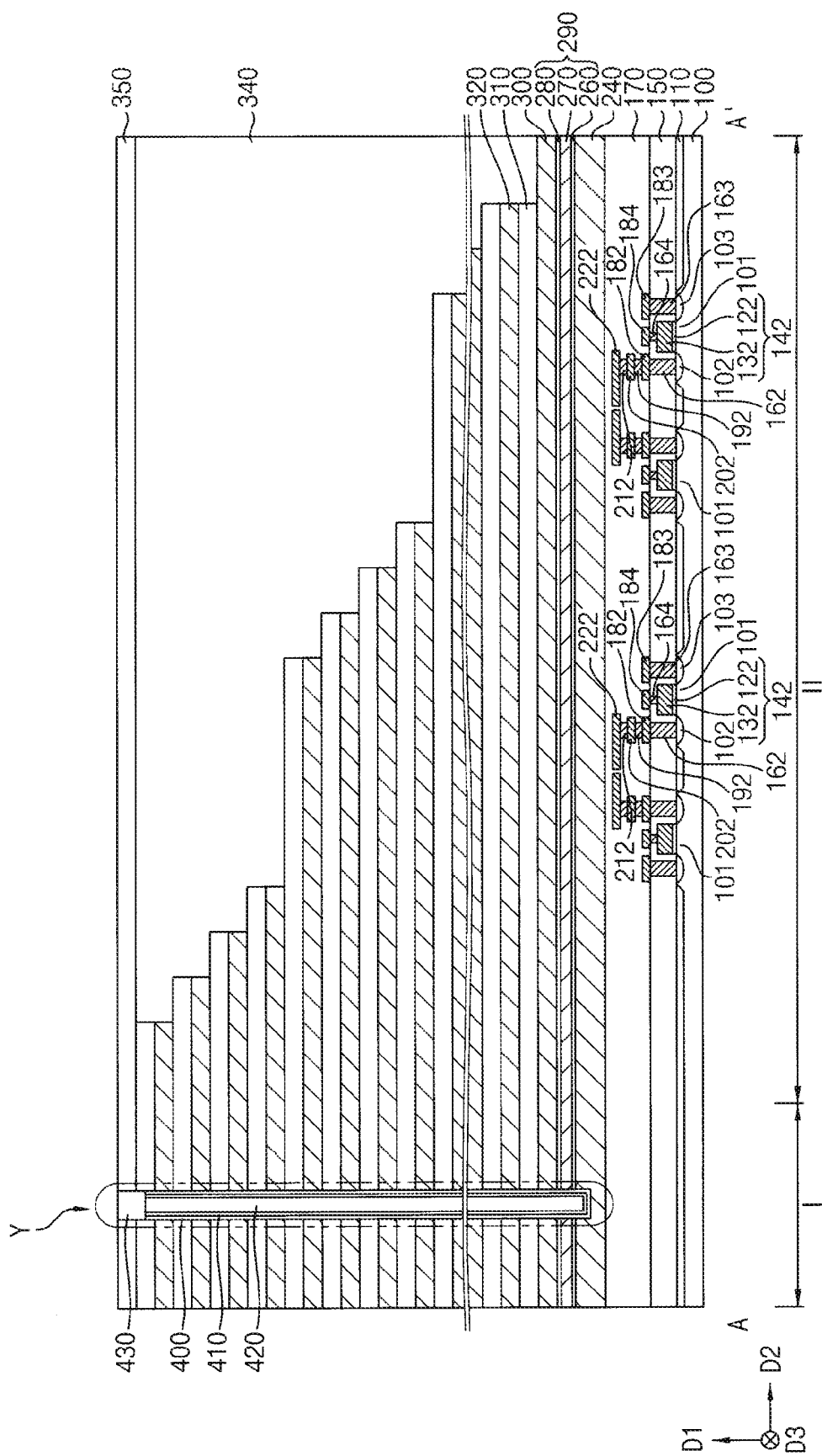
Figure 7B:
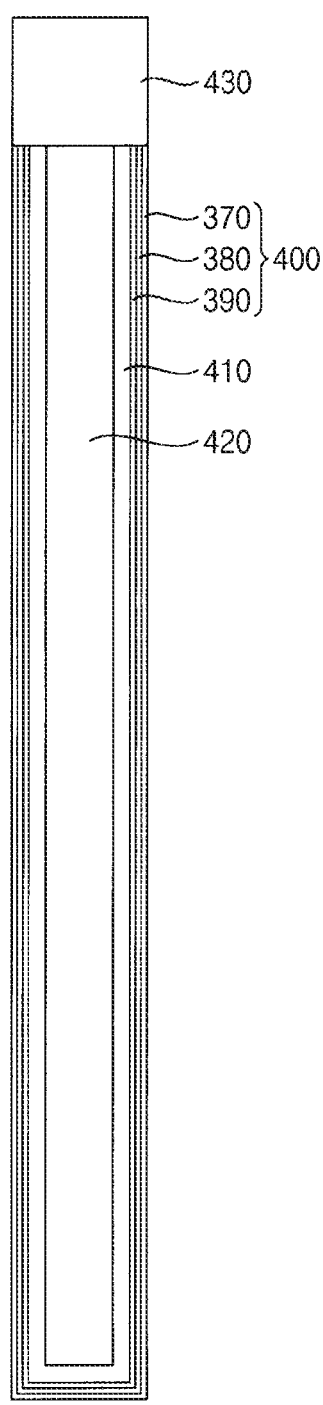

Referring to FIGS. 6, 7A and 7B, a third insulating interlayer 340 may be formed on the CSP 240 to cover the mold and an upper surface of the exposed portion of the first support layer 300, and may be planarized until an upper surface of the uppermost one of the insulation layers 310 is exposed. Thus, a sidewall of the mold may be covered by the third insulating interlayer 340. A fourth insulating interlayer 350 may be formed on the mold and the third insulating interlayer 340.

A channel hole may be formed through the fourth insulating interlayer 350, the mold, the first support layer 300, and the first sacrificial layer structure 290 to expose an upper surface of a portion of the CSP 240 on the first region I of the substrate 100. In example embodiments, a plurality of channel holes may be formed in each of the second and third directions D2 and D3.

A charge storage structure layer and a channel layer may be formed on a sidewall of each of the channel holes, the exposed upper surface of the CSP 240, and an upper surface of the fourth insulating interlayer 350, and a filling layer may be formed on the channel layer to fill the channel holes. The filling layer, the channel layer and the charge storage structure layer may be planarized until the upper surface of the fourth insulating interlayer 350 is exposed to form a charge storage structure 400, a channel 410 and a first filling pattern 420 in each of the channel holes. Each of the charge storage structure 400, the channel 410 and the first filling pattern 420 may extend in the first direction D1.

In example embodiments, the charge storage structure 400 may include a tunnel insulation pattern 390, a charge storage pattern 380, and a first blocking pattern 370 sequentially stacked in a horizontal direction substantially parallel to the upper surface of the substrate 100 from an outer sidewall of the channel 410. The tunnel insulation pattern 390 and the first blocking pattern 370 may include an oxide, e.g., silicon oxide, and the charge storage pattern 380 may include a nitride, e.g., silicon nitride, and the first filling pattern 420 may include an oxide, e.g., silicon oxide.

Upper portions of the charge storage structure 400, the channel 410 and the first filling pattern 420 sequentially stacked in each of the channel holes may be removed to form a first trench, and a capping pattern 430 may be formed to fill the first trench. The capping pattern 430 may include, e.g., polysilicon doped with n-type impurities.

In example embodiments, a plurality of channels 410 may be formed in each of the second and third directions D2 and D3, which may form a channel array. In example embodiments, the channel array may have a first channel column 410a including a plurality of channels 410 arranged in the second direction D2, and a second channel column 410b including a plurality of channels 410 arranged in the second direction D2 and being spaced apart from the first channel column 410a in the third direction D3. The channels 410 of the second channel column 410b may be located at an acute angel from the channels 410 of the first channel column 410a in the second direction D2 or in the third direction D3.

The first and second channel columns 410a and 410b may be alternately and repeatedly arranged in the third direction D3. In example embodiments, 5 first channel columns 410a and 4 second channel columns 410b may be alternately arranged in the third direction D3, which may form a channel group.

Hereinafter, 4 channel columns in the channel group may be referred to as first, second, third and fourth channel columns 410a, 410b, 410c and 410d, respectively, in the third direction D3, a central channel columns in the channel group may be referred to as a fifth channel column 410e, and other 4 channel columns in the channel group may be referred to as the first, second, third and fourth channel columns 410a, 410b, 410c and 410d, respectively, again in the third direction D3.

2 channel groups arranged in the third direction D3 may form a channel block. A plurality of memory cells including the channels 410, the charge storage structures 400, and gate electrodes illustrated later may also form a memory group and a memory block. An erase operation in the vertical memory device may be performed using the memory block as a unit. FIG. 6 shows 2 memory blocks arranged in the third direction D3, and each memory block may include 2 memory groups arranged in the third direction D3.

The fourth insulating interlayer 350, some of the insulation layers 310, and some of the fourth sacrificial layers 320 may be etched to form a first opening extending therethrough in the second direction D2, and a second division pattern 440 may be formed to fill the first opening.

In example embodiments, the second division pattern 440 may extend through upper portions of some of the channels 410, particularly, ones of the channels 410 included in the fifth channel column 410e of each channel group. In example embodiments, the second division pattern 440 may extend through not only the upper portions of the ones of the channels 410 but also the fourth insulating interlayer 350, upper two fourth sacrificial layers 320, upper two insulation layers 310, and a portion of one of the insulation layers 310 directly thereunder. The second division pattern 440 may extend in the second direction D2 on the first and second regions I and II of the substrate 100, and may extend through two upper steps of the mold. Thus, two upper fourth sacrificial layers 320 may be divided in the third direction D3 by the second division pattern 440.

Figure 8:
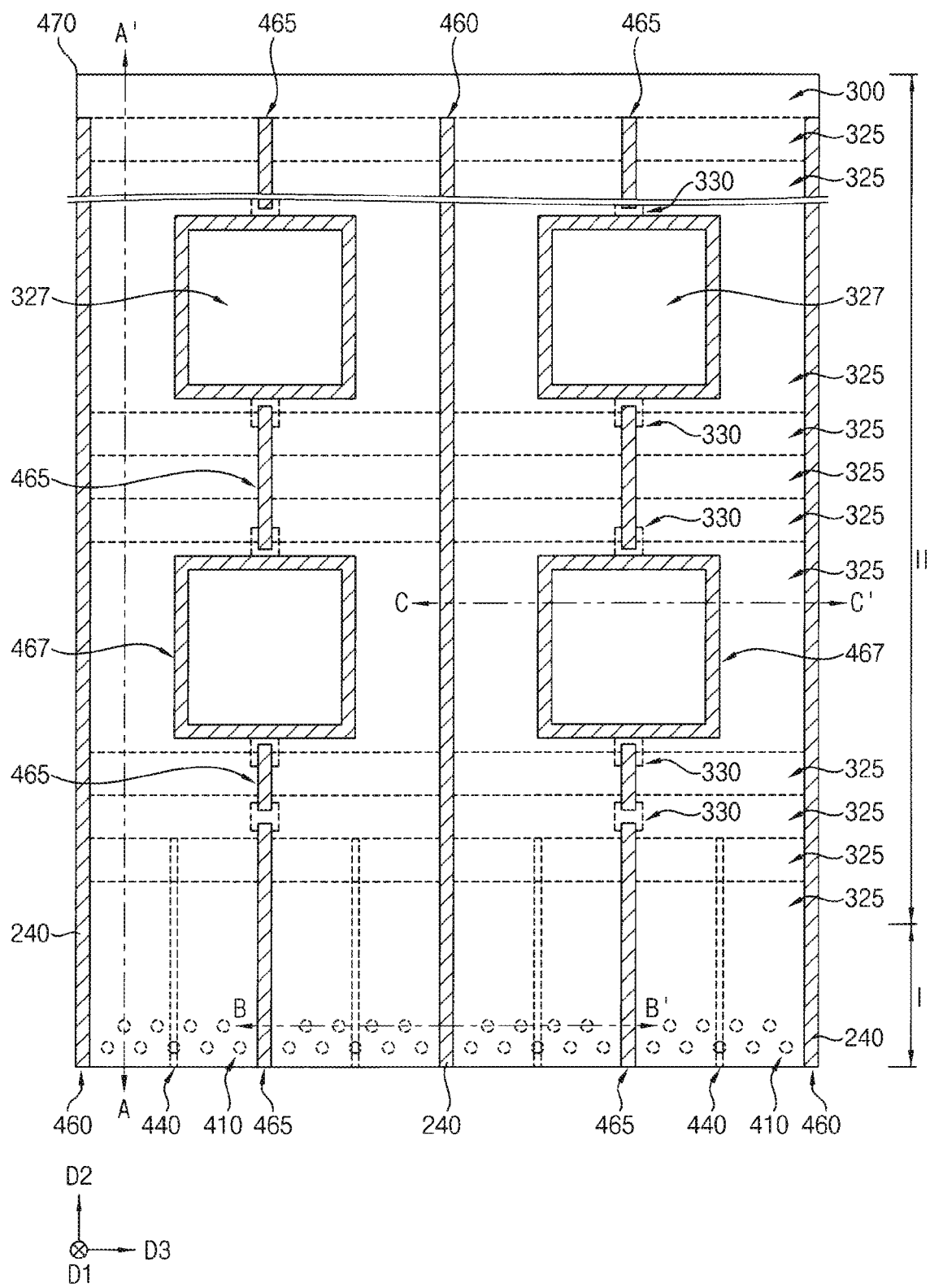
Figure 10:
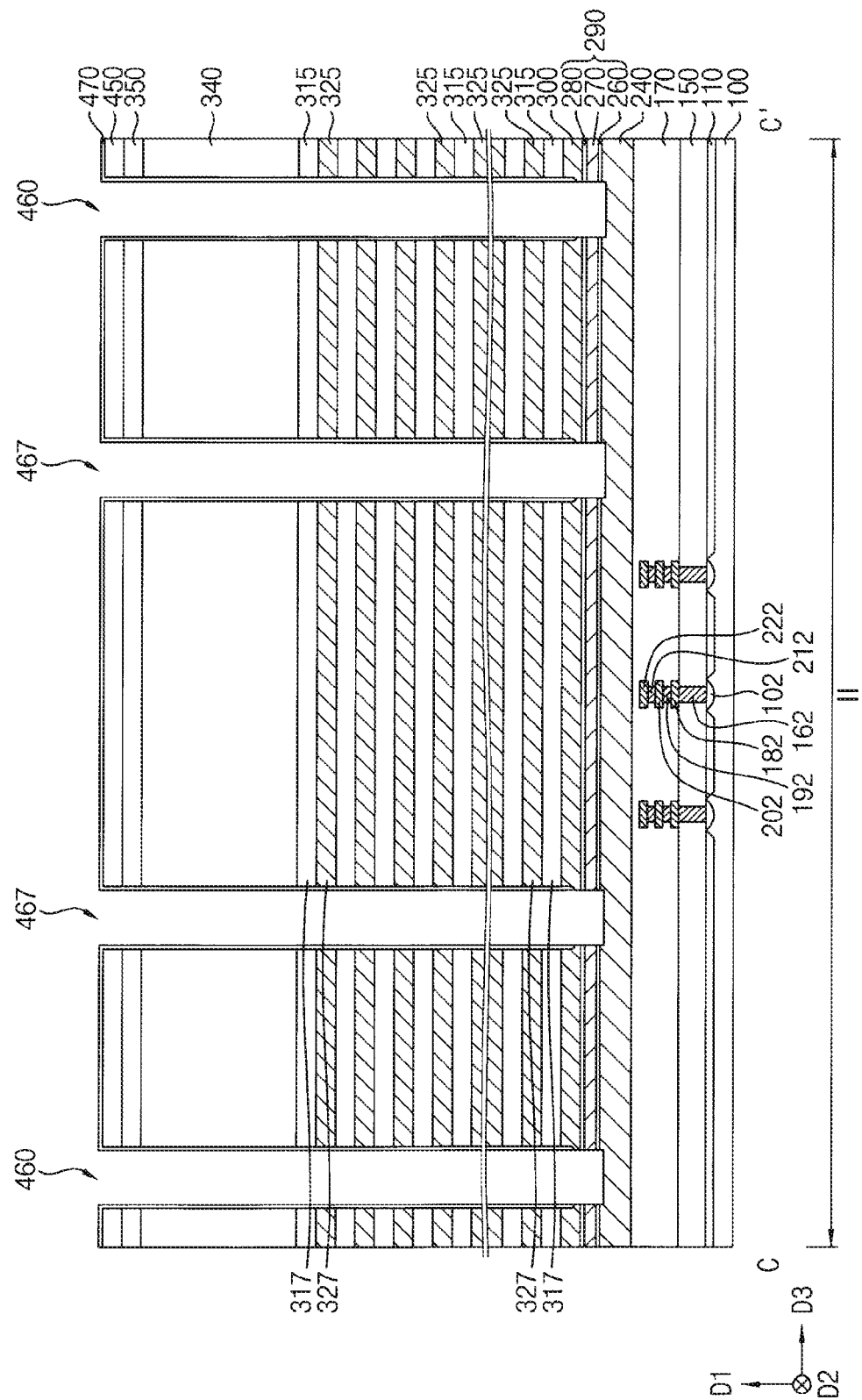

Referring to FIGS. 8 to 10, a fifth insulating interlayer 450 may be formed on the fourth insulating interlayer 350, the capping pattern 430, and the second division pattern 440, and second to fourth openings 460, 465 and 467 may be formed through the third to fifth insulating interlayers 340, 350 and 450 and the mold.

In example embodiments, the second opening 460 may extend in the second direction D2 on the first and second regions I and II of the substrate 100 to opposite ends in the second direction D2 of the mold having the staircase shape, and a plurality of second openings 460 may be spaced apart from each other in the third direction D3. Thus, the mold may be divided into a plurality of pieces in the third direction D3 by the second openings 460. In example embodiments, each of the second openings 460 may be formed between the memory blocks. That is, the memory blocks may be spaced apart from each other in the third direction D3 by the second openings 460.

As the second opening 460 is formed, the insulation layers 310 and the fourth sacrificial layers 320 included in the mold may be transformed into first insulation patterns 315 and fourth sacrificial patterns 325, respectively.

In example embodiments, a plurality of third openings 465 may be spaced apart from each other in the second direction D2 on the first and second regions I and II of the substrate 100. The third openings 465 arranged in the second direction D2 may be formed between ones of the second openings 460 neighboring in the second direction D2. In example embodiments, the third openings 465 may be formed between memory groups included in each of the memory blocks spaced apart from each other by the second openings 460. That is, the memory groups may be spaced apart from each other in the third direction D3 by the third openings 465 in each memory block.

However, unlike the second opening 460 extending to opposite ends in the second direction D2 of the mold, the third openings 465 may be spaced apart from each other in the second direction D2, and thus the memory groups included in each memory block may not be entirely divided by the third openings 465. In example embodiments, each portion of the mold between ones of the third openings 465 neighboring in the second direction D2 may overlap the first division pattern 330 in the first direction D1.

Each of the third openings 465 may continuously extend in the second direction D2 on the first region I of the substrate 100, and may extend to opposite ends of the two upper steps of the mold on the second region II of the substrate 100. Thus, ones of the fourth sacrificial patterns 325 at two upper levels, respectively, may be divided in the third direction D3 by the third opening 465 and the second division patterns 440 at opposite sides, respectively, of the third opening 465 in the second direction D2.

The fourth opening 467 may be formed on the second region II of the substrate 100, and may have a closed shape in a plan view. Hereinafter, portions of the insulation layer 310 and the fourth sacrificial layer 320 closed by the fourth opening 467 may be referred to as second and third insulation patterns 317 and 327, respectively, which may form an insulation pattern structure. In example embodiments, the fourth opening 467 may extend through the second step having a relatively large length in the second direction D2 in each mold, and may be formed between ones of the second openings 460 neighboring in the third direction D3.

In example embodiments, the fourth opening 467 may have a rectangular ring shape in a plan view, and each of opposite sides facing each other in the third direction D3 may be aligned with the second division pattern 440 in the second direction D2. However, the inventive concepts may not be limited thereto, and the fourth opening 467 may have other closed shapes, e.g., a rectangle ring shape having rounded corners, an elliptical ring shape, a circular ring shape, etc.

In example embodiments, the fourth opening 467 may be formed between ones of the third openings 465 spaced apart from each other in the second direction D2, and may be spaced apart from the third openings 465. At least a portion of the fourth opening 467 may overlap the first division pattern 330 in the first direction D1. Thus, a lowermost one of the fourth sacrificial patterns 325 between the second openings 460 may be divided in the third direction D3 on the first region I of the substrate 100 by the third opening 465 extending in the second direction D2, and may be divided in the third direction D3 on the second region II of the substrate 100 by the third openings 465, the fourth openings 467 between the third openings 465, and the first division patterns 330 being overlapped in the first direction D1 by portions of the mold between the third openings 465 and between the third and fourth openings 465 and 467.

In example embodiments, the etching process may be performed until the second to fourth openings 460, 465 and 467 expose an upper surface of the first support layer 300, and further extend through an upper portion of the first support layer 300.

A first spacer layer may be formed on sidewalls of the second to fourth openings 460, 465 and 467 and the fifth insulating interlayer 450, and may be anisotropically etched to remove portions of the first spacer layer on bottoms of the second to fourth openings 460, 465 and 467, so that a first spacer 470 may be formed and that an upper surface of the first support layer 300 may be partially exposed.

The exposed portion of the first support layer 300 and a portion of the first sacrificial layer structure 290 thereunder may be removed to enlarge each of the second to fourth openings 460, 465 and 467 downwardly. Thus, the second to fourth openings 460, 465 and 467 may expose an upper surface of CSP 240, and further extend through an upper portion of the CSP 240.

In example embodiments, the first spacer 470 may include undoped polysilicon. When the first sacrificial layer structure 290 is partially removed, the sidewalls of the second to fourth openings 460, 465 and 467 may be covered by the first spacer 470, so that the first insulation patterns 315 and the fourth sacrificial patterns 325 of the mold may not be removed.

Figure 11:
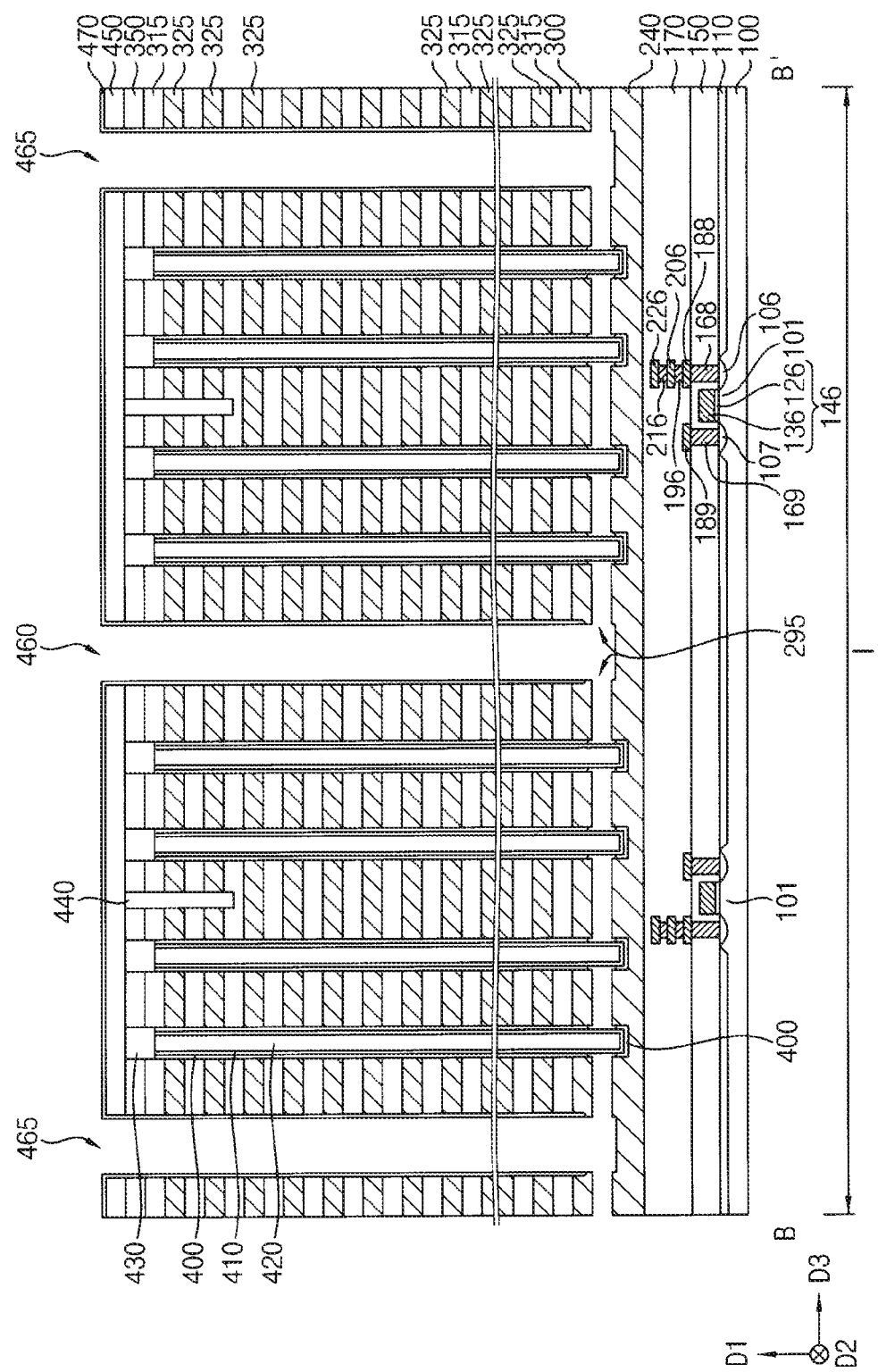

Referring to FIG. 11, the first sacrificial layer structure 290 exposed by the second to fourth openings 460, 465 and 467 may be removed by, e.g., a wet etching process to form a first gap 295.

The wet etching process may be performed using, e.g., hydrofluoric acid or phosphoric acid.

As the first gap 295 is formed, a lower surface of the first support layer 300 and an upper surface of the CSP 240 may be exposed. Additionally, a portion of a sidewall of the charge storage structure 400 may be exposed by the first gap 295, and the exposed portion of the sidewall of the charge storage structure 400 may be also removed during the wet etching process to expose an outer sidewall of the channel 410. Accordingly, the charge storage structure 400 may be divided into an upper portion extending through the mold and covering most of the outer sidewall of the channel 410, and a lower portion covering a bottom surface of the channel 410 on the CSP 240.

When the first gap 295 is formed, a portion of the second division pattern 235 at the same height as the sacrificial layer structure 140 may be also removed to form a second gap 275.

Figure 12:
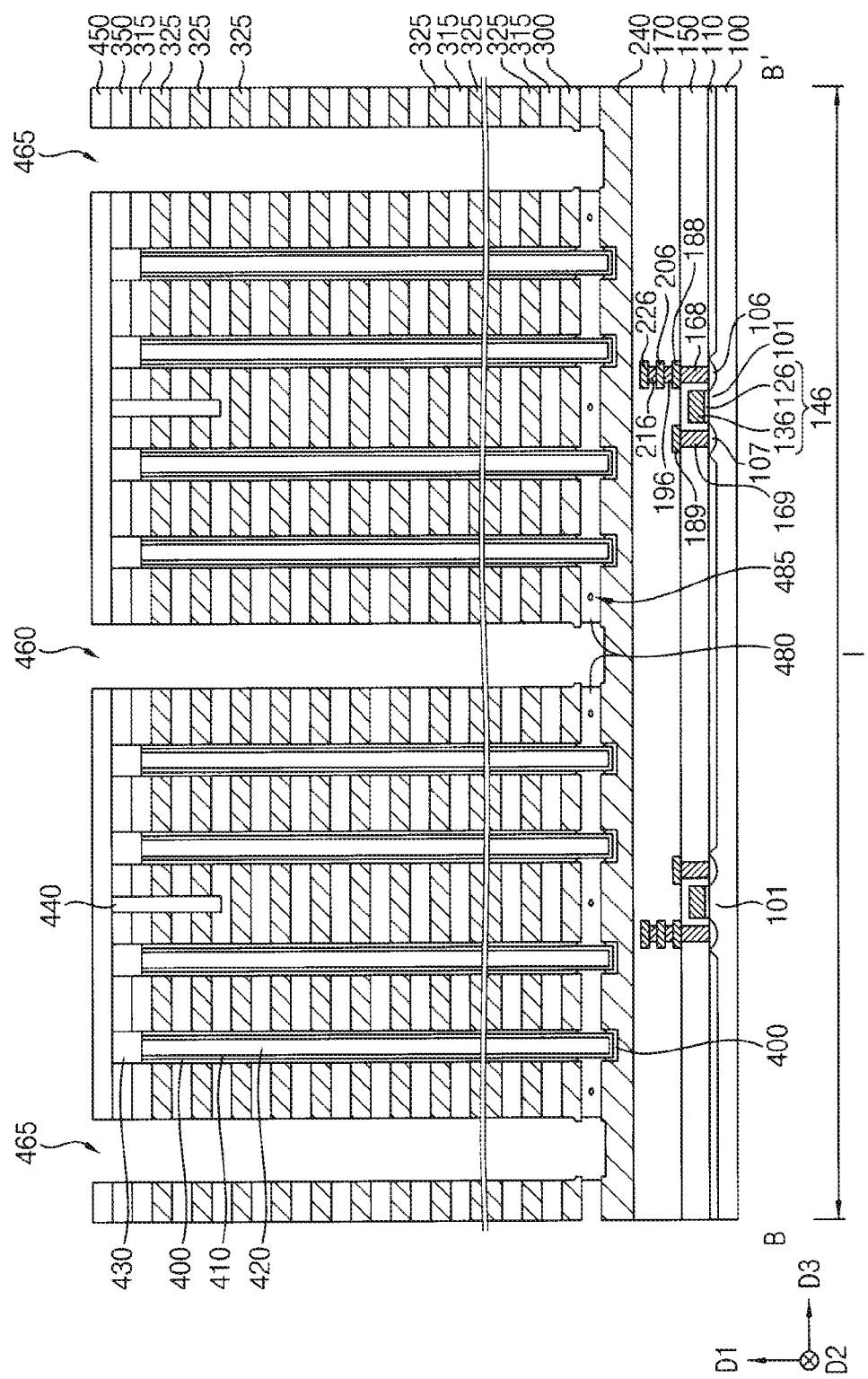

Referring to FIG. 12, the first spacer 470 may be removed, a channel connection layer may be formed on the sidewalls of the second to fourth openings 460, 465 and 467 and in the first gap 295, and for example, an etch back process or a wet etching process may be performed to remove portions of the channel connection layer in the second to fourth openings 460, 465 and 467, so that a channel connection pattern 480 may be formed in the first gap 295.

As the channel connection pattern 480 is formed, the channels 410 between ones of the second and third openings 460 and 465 neighboring in the third direction D3, that is, the channels 410 in each channel group may be connected with each other.

The channel connection pattern 480 may include, e.g., polysilicon doped with n-type impurities or undoped polysilicon.

An air gap 485 may be formed in the channel connection pattern 480.

Figure 13:
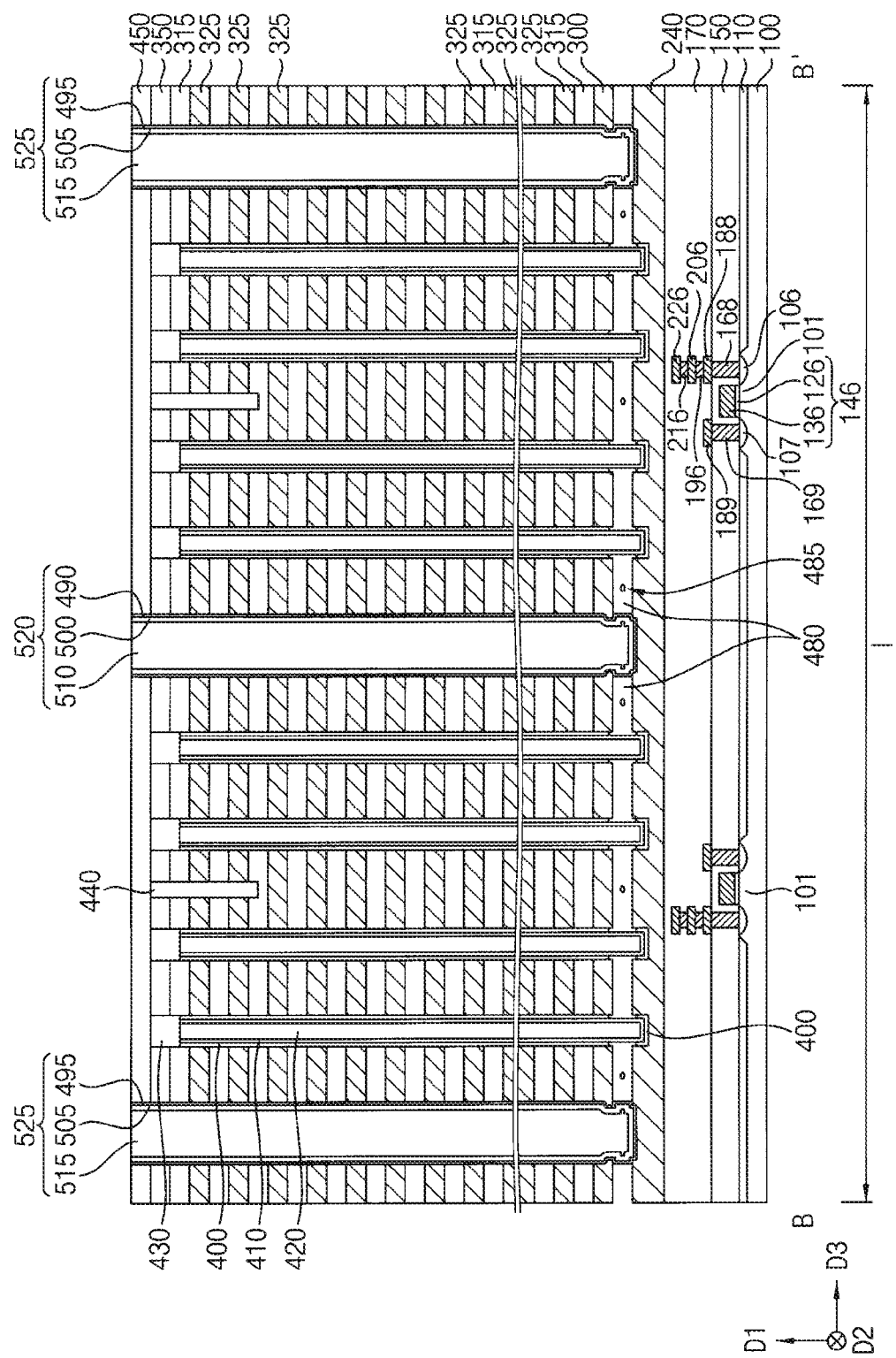
Figure 14:
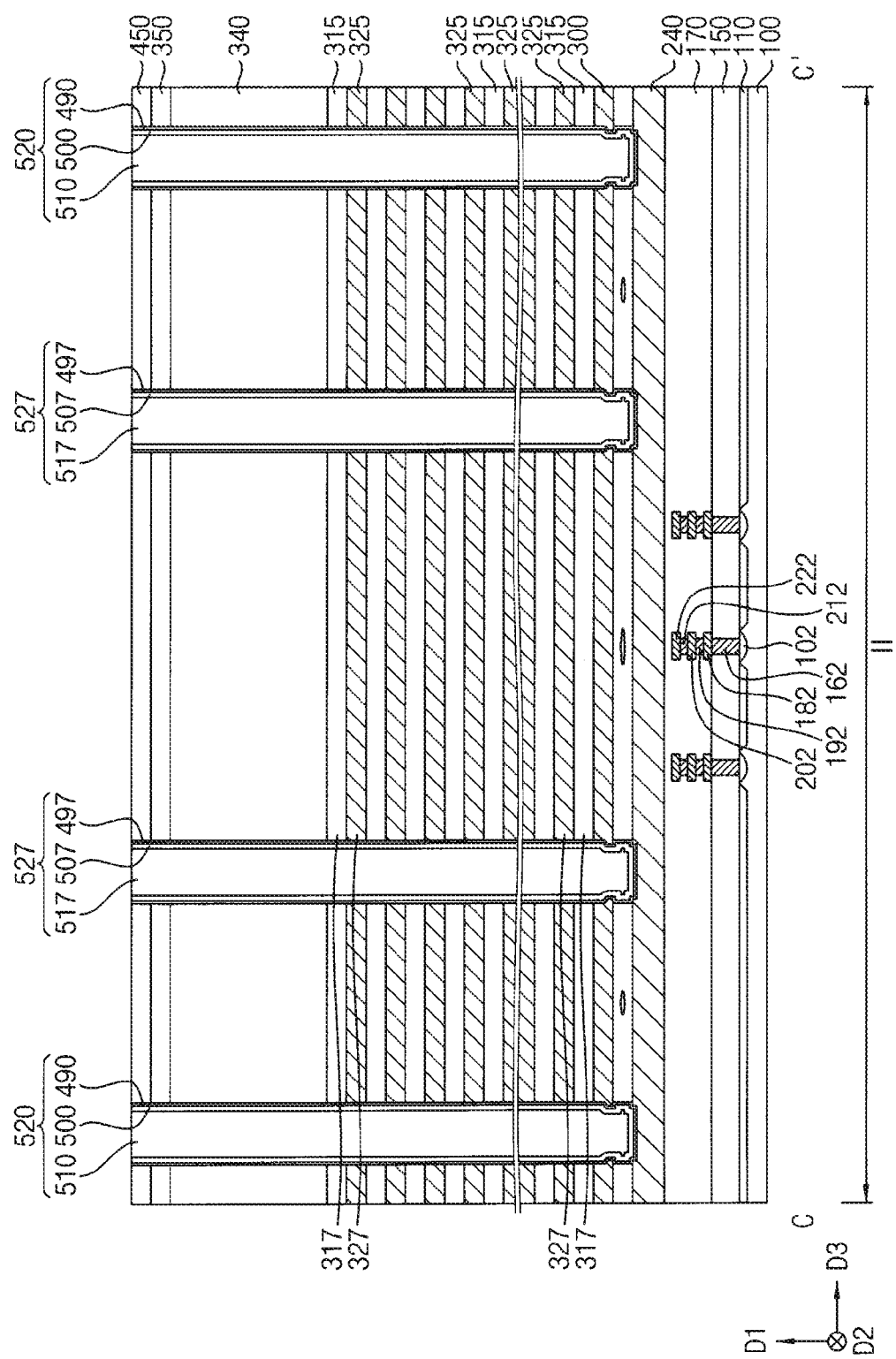

Referring to FIGS. 13 and 14, second and third sacrificial layer structures 520 and 525 and an etch stop structure 527 may be formed in the second, third and fourth openings 460, 465 and 467, respectively.

The second and third sacrificial layer structures 520 and 525 and the etch stop structure 527 may be formed by sequentially forming an etch stop layer and a second spacer layer on the sidewalls of the second to fourth openings 460, 465 and 467 and the exposed upper surface of the CSP 240, forming a fifth sacrificial layer on the second spacer layer to fill the second to fourth openings 460, 465 and 467, and planarizing the fifth sacrificial layer, the second spacer layer and the etch stop layer until an upper surface of the fifth insulating interlayer 450 is exposed.

The second sacrificial layer structure 520 may include a first etch stop pattern 490, a second spacer 500 and a fifth sacrificial pattern 510 sequentially stacked, the third sacrificial layer structure 525 may include a second etch stop pattern 495, a third spacer 505 and a sixth sacrificial pattern 515 sequentially stacked, and the etch stop structure 527 may include a third etch stop pattern 497, a fourth spacer 507 and a second filling pattern 517 sequentially stacked.

The etch stop layer may include a material having an etching selectivity with respect to the fourth sacrificial pattern 325, e.g., an oxide such as silicon oxide. The second spacer layer may include a nitride, e.g., silicon nitride, and the fifth sacrificial layer may include, e.g., polysilicon, or an oxide such as silicon oxide.

Figure 15:
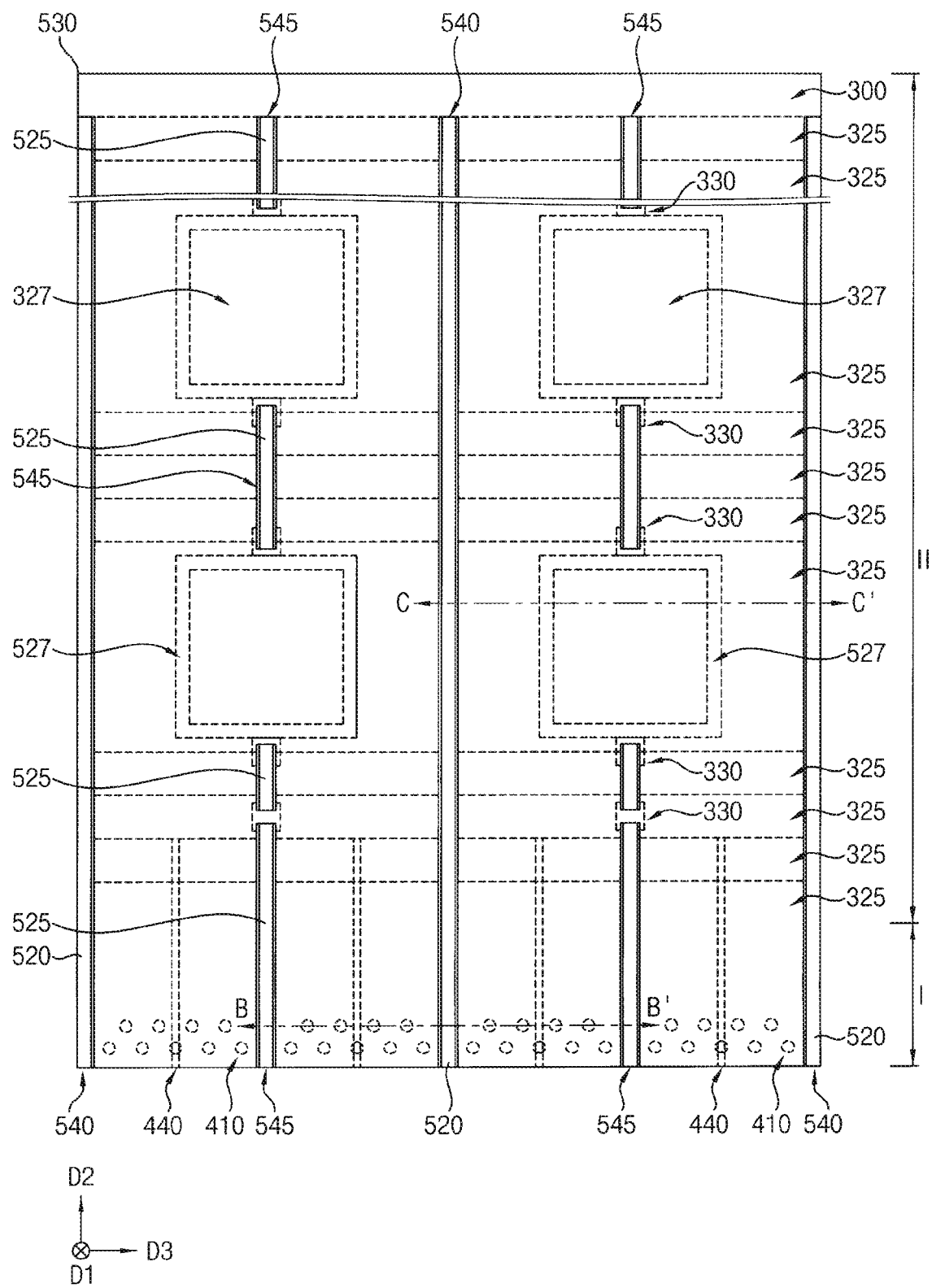
Figure 16:
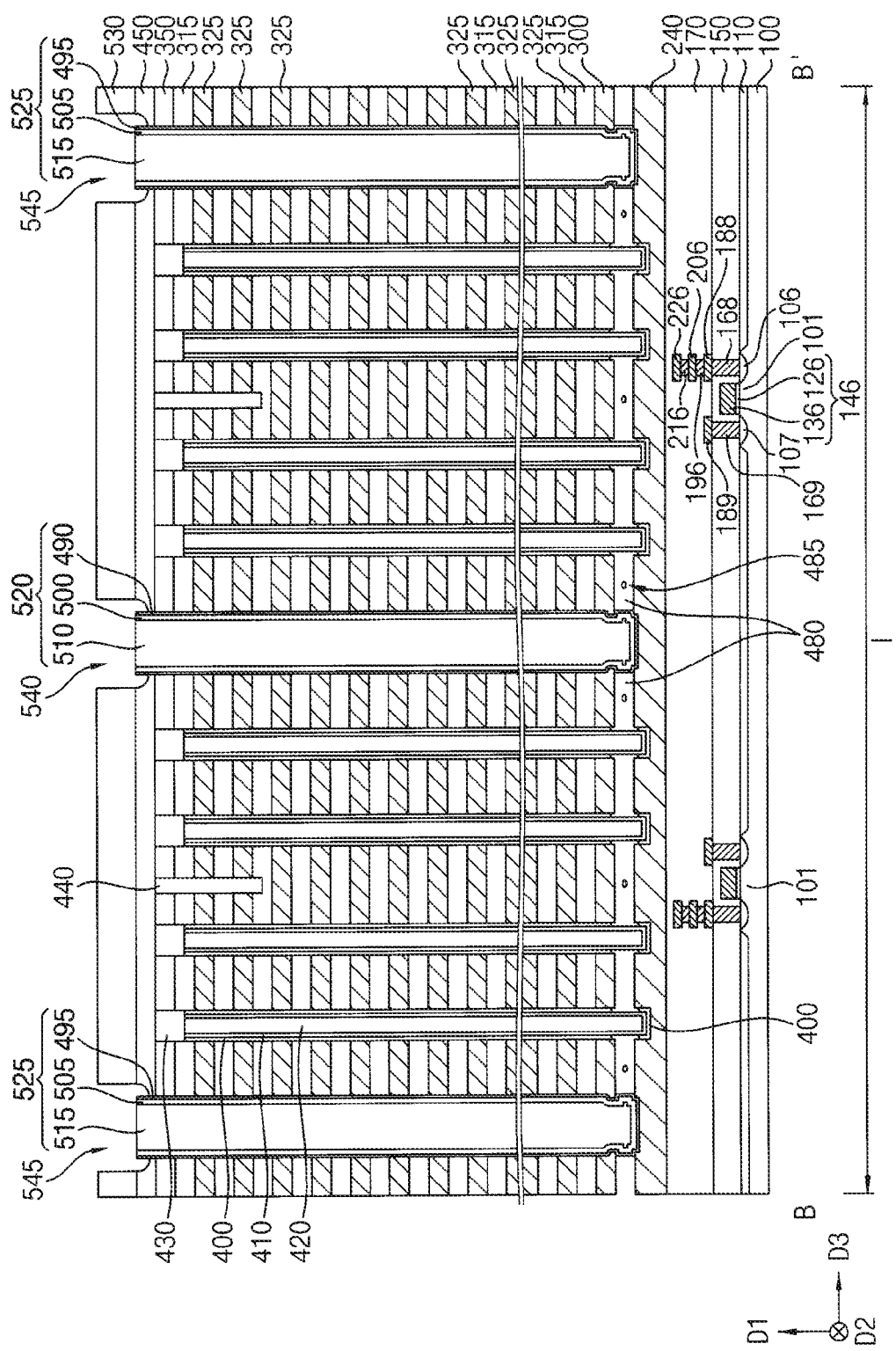
Figure 17:
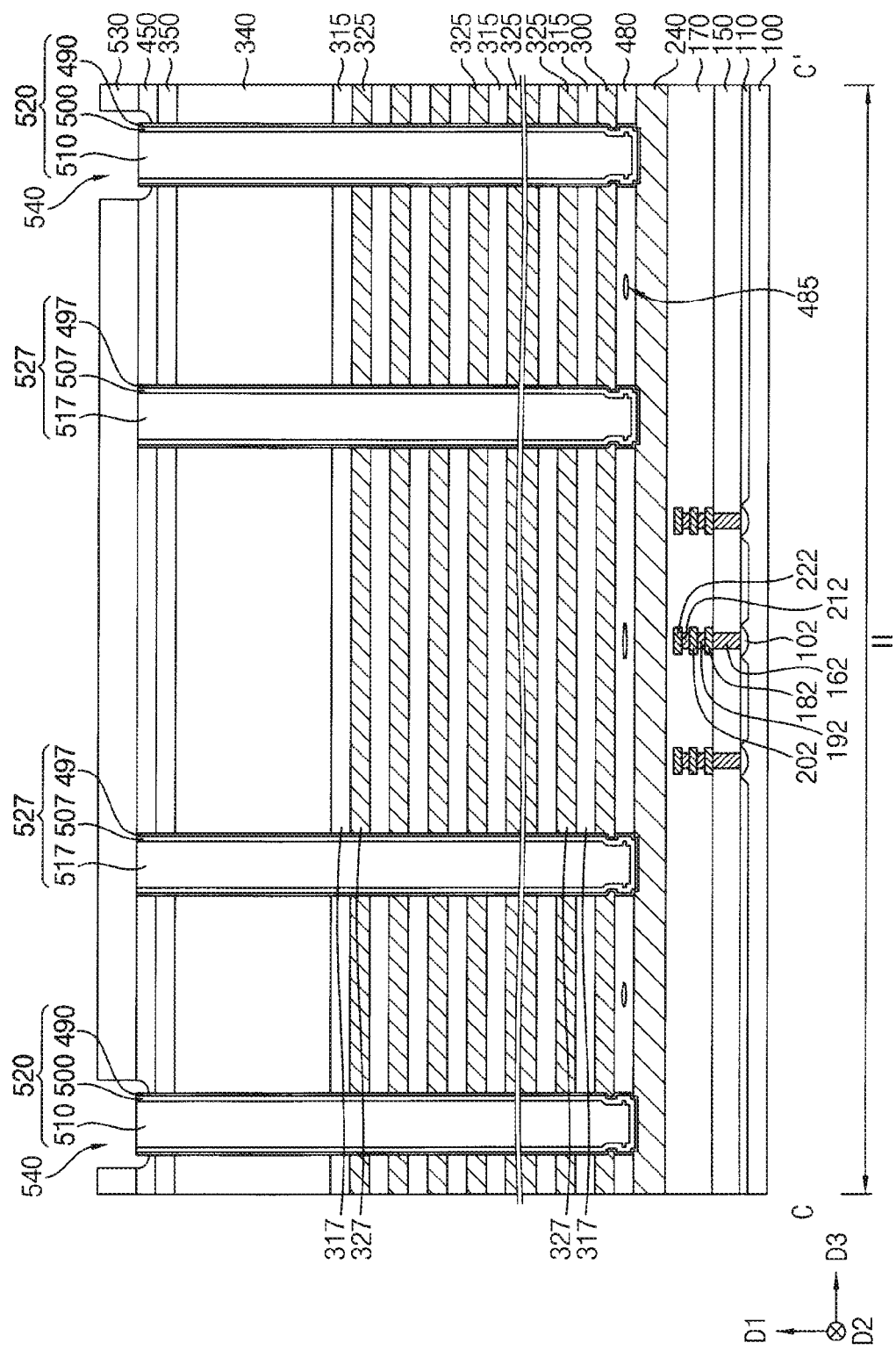

Referring to FIGS. 15 to 17, a second support layer 530 may be formed on the fifth insulating interlayer 450 and the second and third sacrificial layer structures 520 and 525, and may be partially etched to form fifth and sixth openings 540 and 545.

In example embodiments, the fifth opening 540 may overlap the second sacrificial layer structure 520 in the first direction D1. The fifth opening 540 may extend in the second direction D2 on the second region II of the substrate 100, however, a plurality of fifth openings 540 may be spaced apart from each other in the second direction D2 on the same second sacrificial layer structure 520 on the first region I of the substrate 100. In example embodiments, the fifth opening 540 may have a width in the third direction D3 greater than that of the second sacrificial layer structure 520, however, the inventive concepts may not be limited thereto.

In example embodiments, the sixth opening 545 may overlap the third sacrificial layer structure 525 in the first direction D1. Thus, a plurality of sixth openings 545 may be spaced apart from each other in the second direction D2 on the second region II of the substrate 100. Additionally, a plurality of sixth openings 545 may be spaced apart from each other in the second direction D2 on the same third sacrificial layer structure 525 on the first region I of the substrate 100. In example embodiments, the sixth opening 545 may have a width in the third direction D3 greater than that of the third sacrificial layer structure 525, however, the inventive concepts may not be limited thereto.

The second support layer 530 may include an oxide, e.g., silicon oxide. The etch stop structure 527 may be entirely covered by the second support layer 530, and may not be exposed.

Figure 18A:
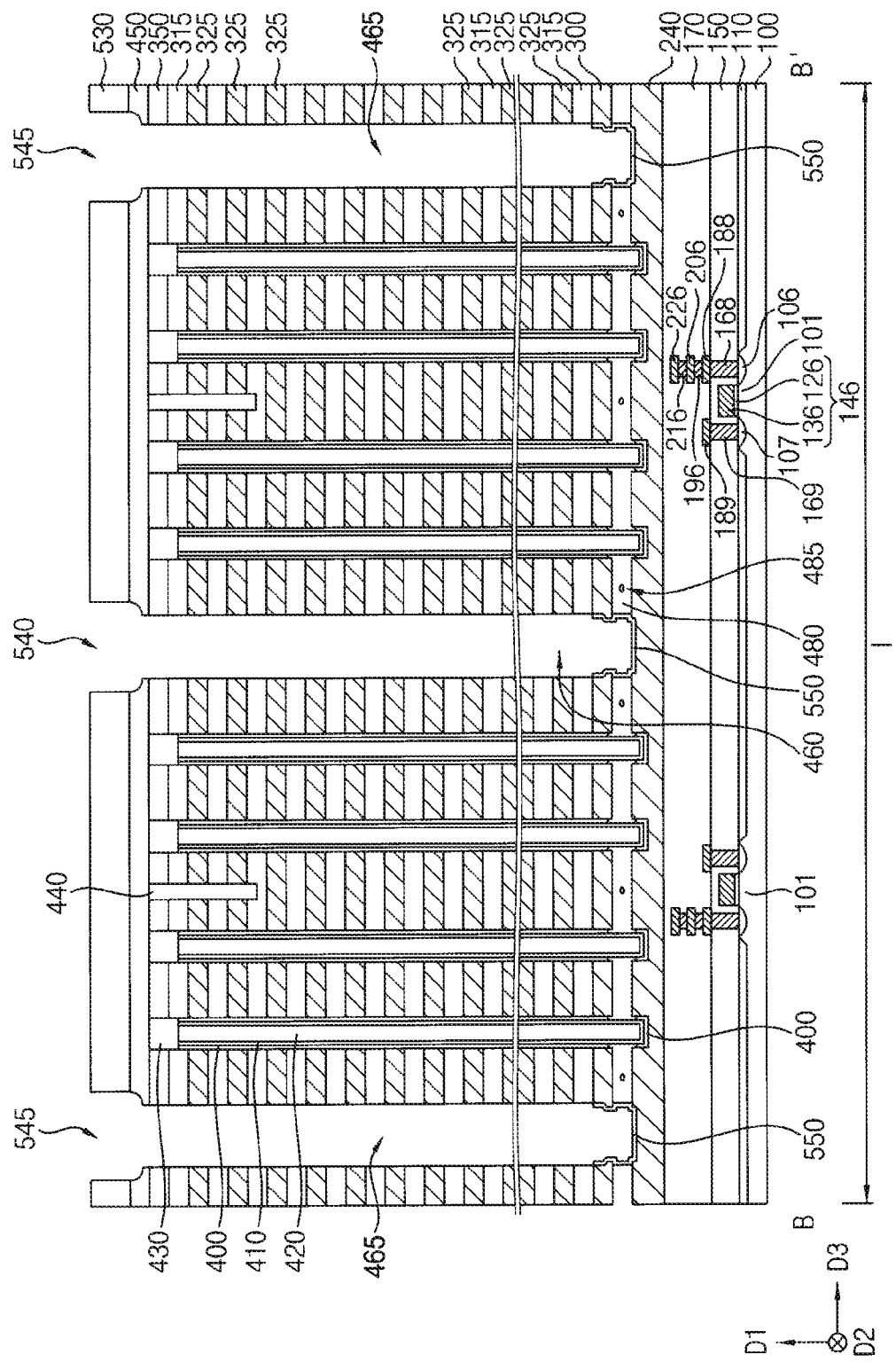
Figure 18B:
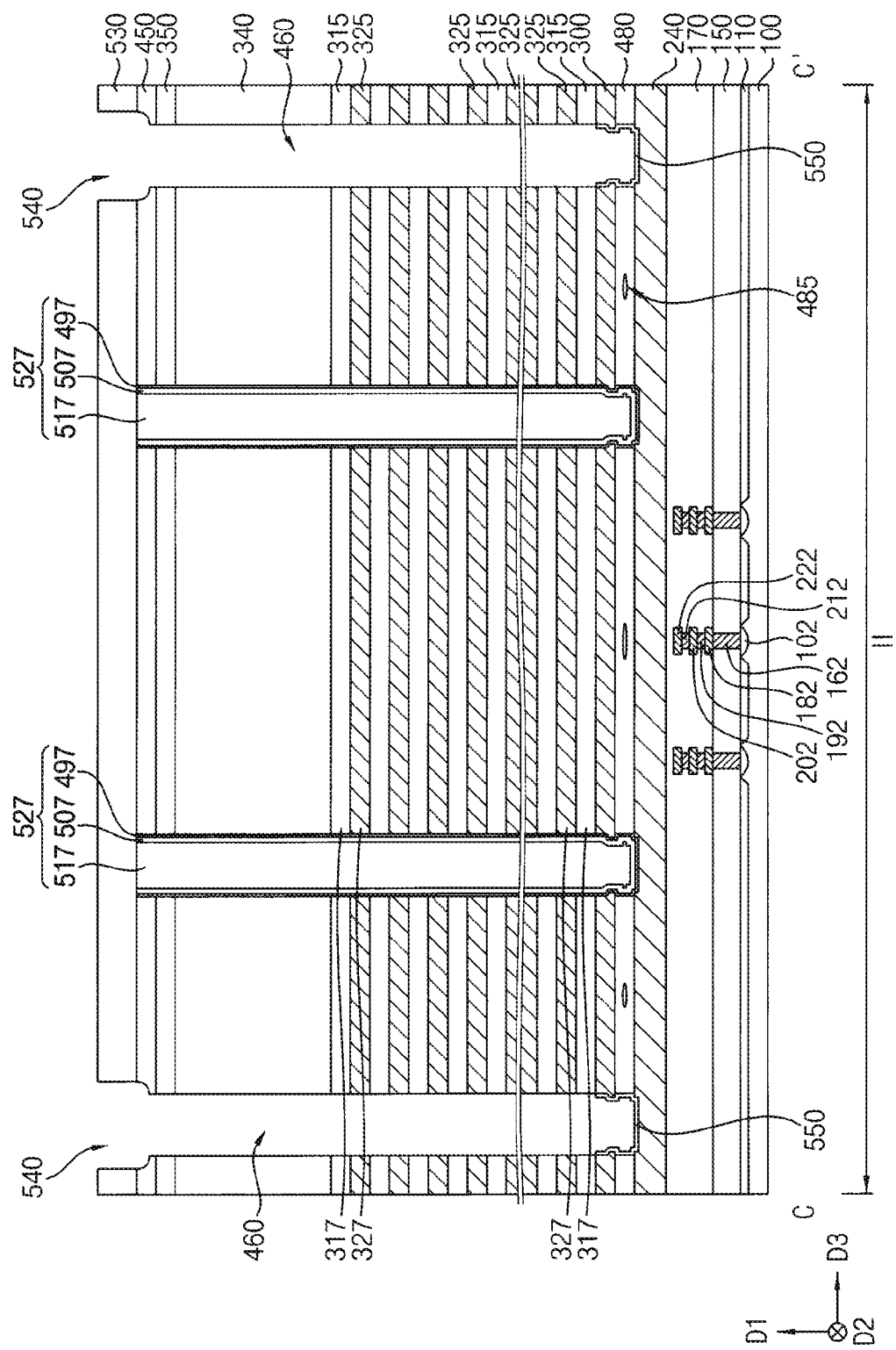

Referring to FIGS. 18A and 18B, the second and third sacrificial layer structures 520 and 525 may be removed through the fifth and sixth openings 540 and 545, and thus the second and third openings 460 and 465 may be formed again.

As illustrated above, the fifth and sixth openings 540 and 545 may not entirely cover but may only partially cover upper surfaces of the second and third sacrificial layer structures 520 and 525 at least on the first region I of the substrate 100, and thus, even though the second and third openings 460 and 465 are formed again, the upper surfaces of the second and third sacrificial layer structures 520 and 525 may be at least partially covered. Accordingly, even though a height of an upper surface of the mold is high and a length in the second direction D2 of the mold is long, the mold may not lean or fall down in the third direction D3 because of the second support layer 530.

In example embodiments, the second and third sacrificial layer structures 520 and 525 may be removed by a wet etching process.

The etch stop structure 527 may be entirely covered by the second support layer 530 not to be exposed, and thus may not be removed by the etching process.

An oxidation process may be performed on a layer structure including silicon exposed by the second and third openings 460 and 465 to form a protection layer 550. In example embodiments, the protection layer 550 may be formed on the upper surface of the CSP exposed by the second and third openings 460 and 465, a sidewall of the channel connection pattern 480, and a sidewall of the first support layer 300. The protection layer 550 may include, e.g., silicon oxide.

Figure 19:
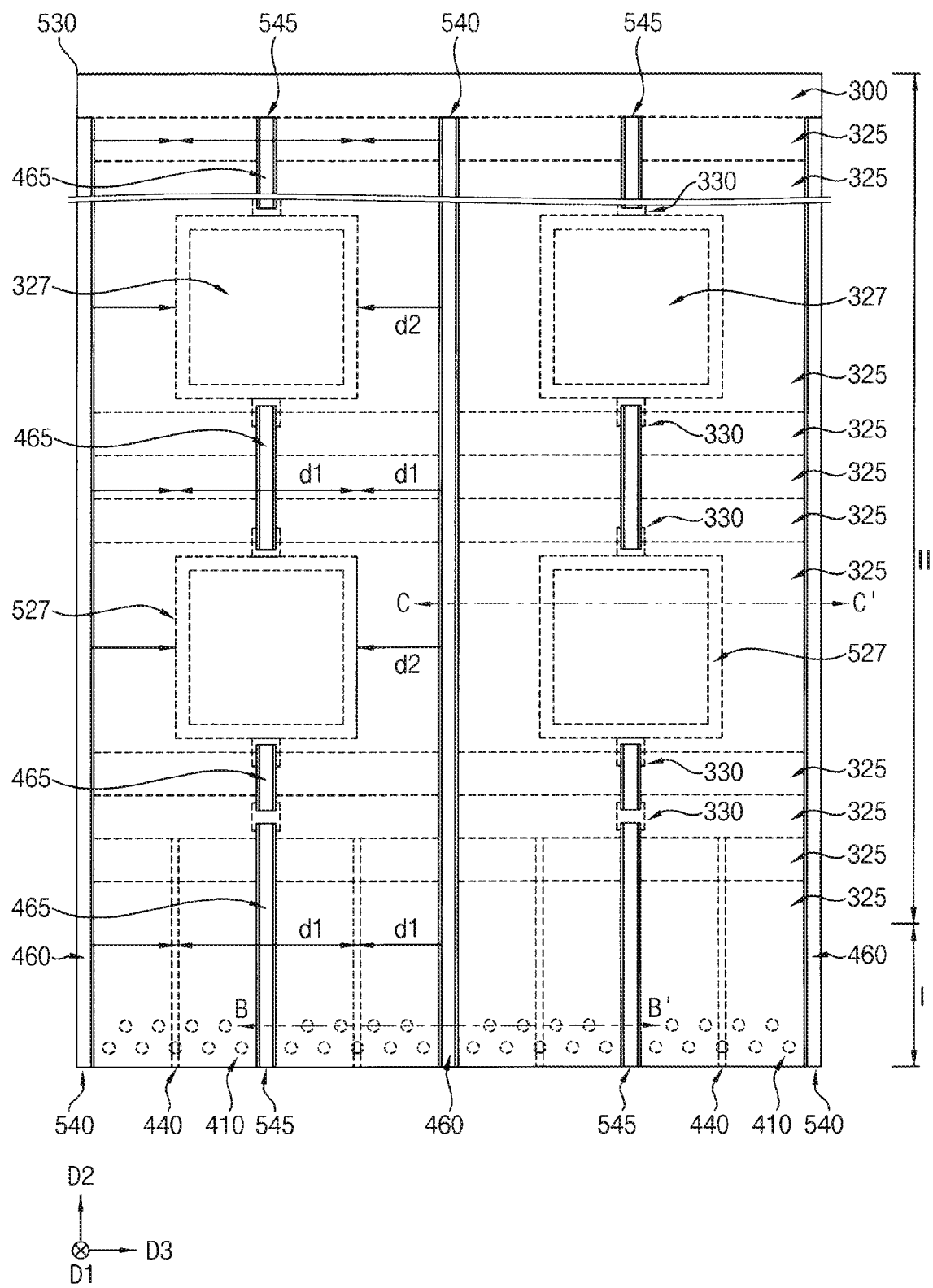
Figure 20:
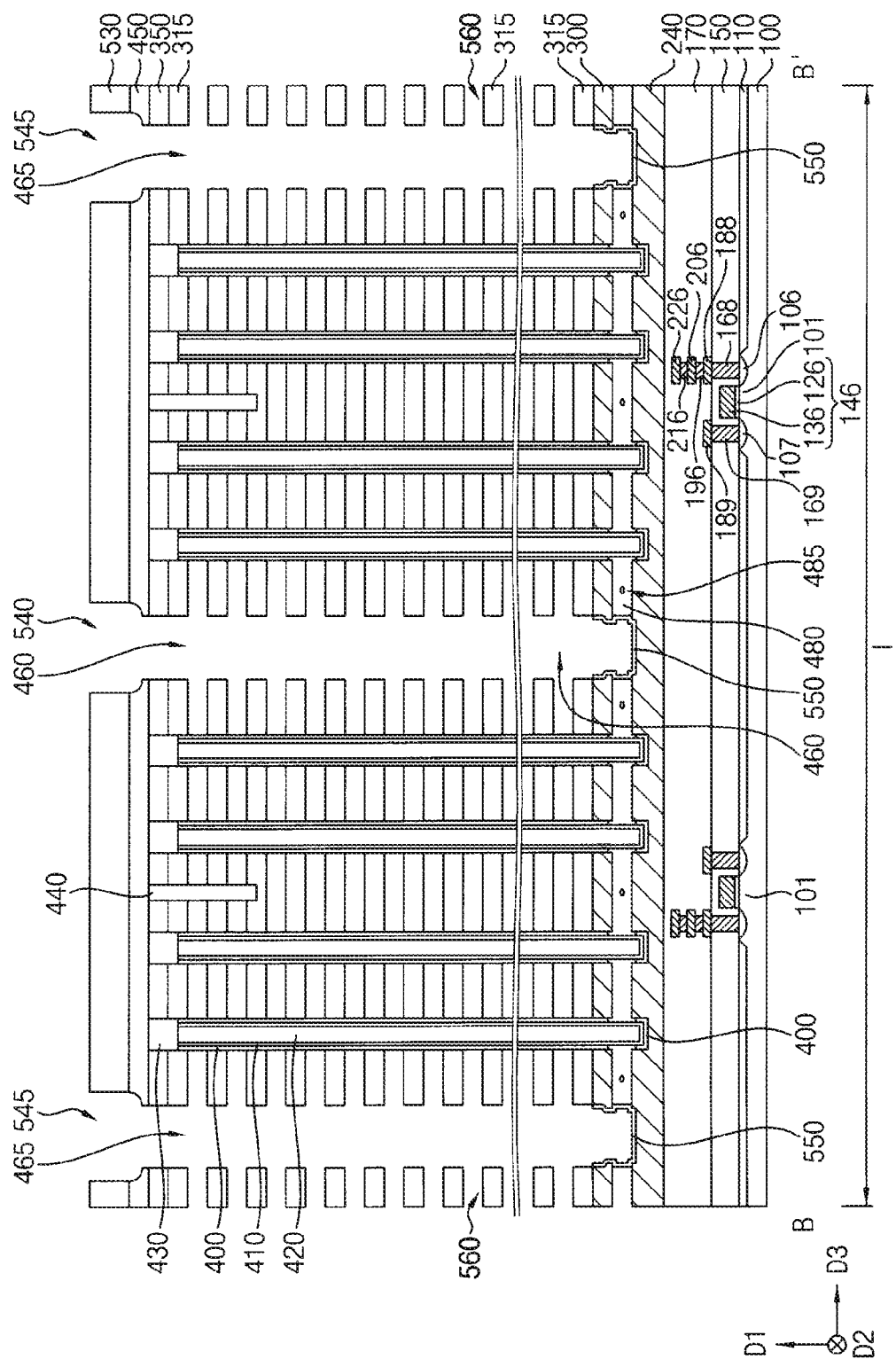
Figure 21:
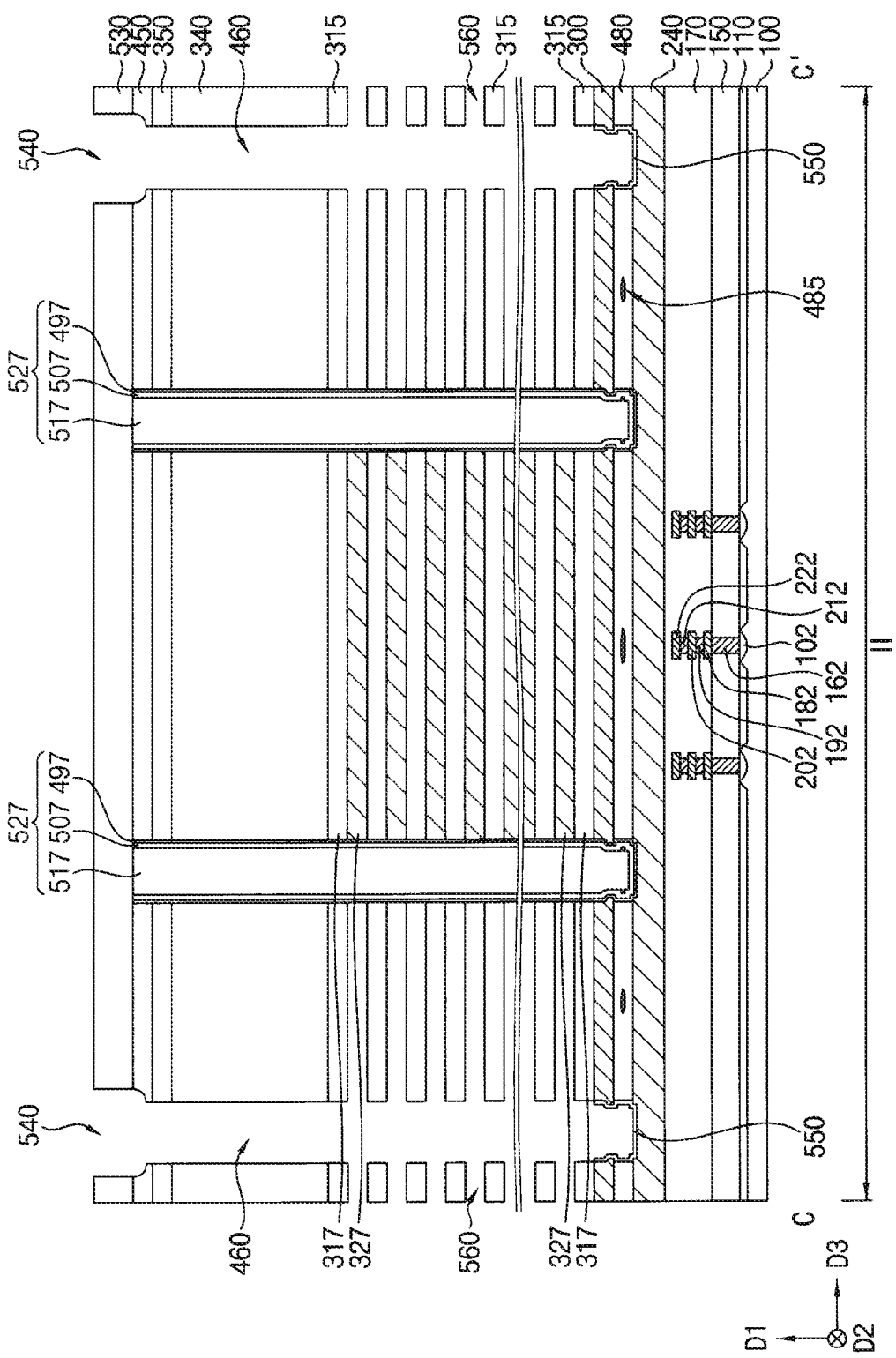

Referring to FIGS. 19 to 21, the fourth sacrificial patterns 325 exposed by the second and third openings 460 and 465 may be removed to form a second gap 560 between the first insulation patterns 315 at respective levels, and a portion of an outer sidewall of the charge storage structure 400 may be exposed by the second gap 560.

In example embodiments, the fourth sacrificial patterns 325 may be removed by a wet etching process using phosphoric acid or sulfuric acid.

The wet etching process may be performed through the second and third openings 460 and 465, and the fourth sacrificial pattern 325 may be entirely removed by an etching solution provided in both directions from the second and third openings 460 and 465. However, the etching solution may be provided in one direction from the second opening 460 at an area where the etch stop structure 527 is formed, so that a portion of the fourth sacrificial pattern 325 between the second opening 460 and the etch stop structure 527 may be removed.

In example embodiments, a second distance d2 in the third direction D3 between the second opening 460 and the etch stop structure 527 may be equal to or less than a first distance d1 that is half a distance in the third direction D3 between the second and third openings 460 and 465. Thus, even though the etching solution is provided in one direction from the second opening 460, the portion of the fourth sacrificial pattern 325 between the second opening 460 and the etch stop structure 527 may be easily and entirely removed.

An outer sidewall of the etch stop structure 527 may be exposed by the wet etching process, however, the third etch stop pattern 497 including a material having an etching selectivity with respect to the fourth sacrificial pattern 325 may be formed on the outer sidewall of the etch stop structure 527, and thus the etch stop structure 527 may not be removed by the wet etching process, so that the third insulation pattern 327 surrounded by the etch stop structure 527 may not be removed, either.

Figure 22:
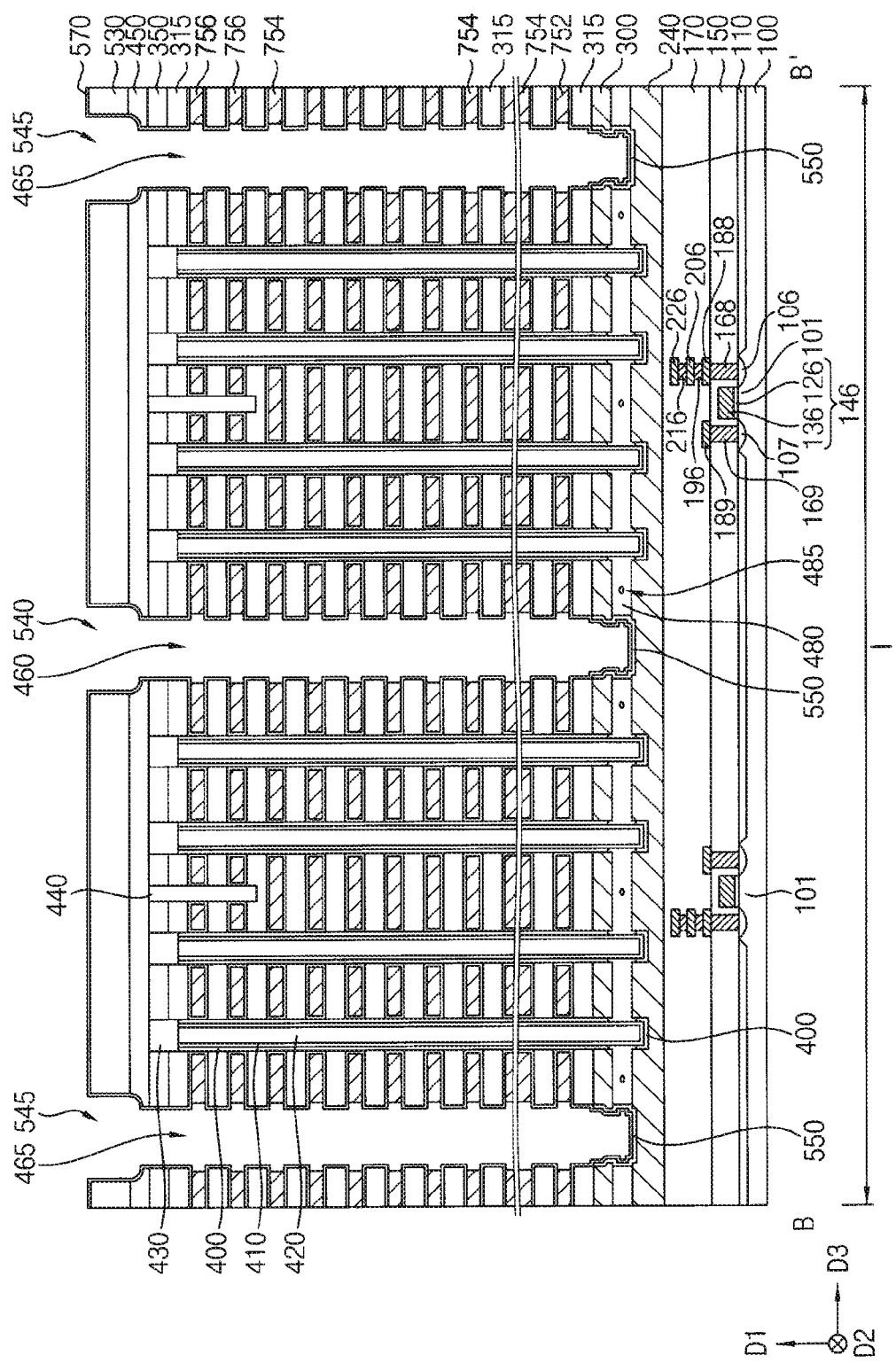
Figure 23:
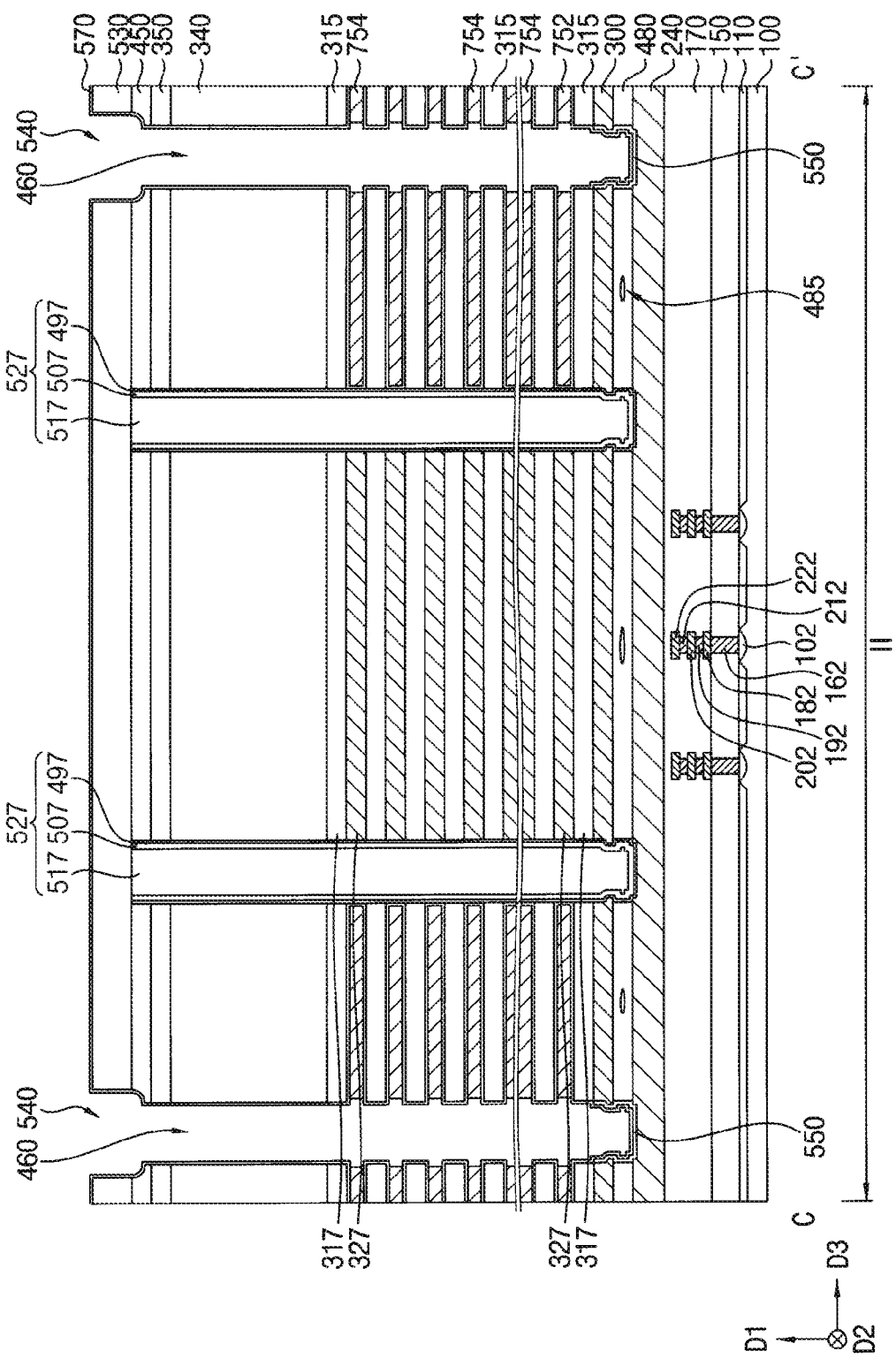

Referring to FIGS. 22 and 23, a second blocking layer 570 may be formed on the exposed portion of the outer sidewall of the charge storage structure 400, the outer sidewall of the etch stop structure 527, inner walls of the second gaps 560, surfaces of the first insulation patterns 315, an upper surface of the protection layer 550, a sidewall and a portion of an upper surface of the fifth insulating interlayer 450, and a sidewall and an upper surface of the second support layer 530, and a gate electrode layer may be formed on the second blocking layer 570.

The gate electrode layer may include a gate barrier layer and a gate conductive layer sequentially stacked. The gate barrier layer may include a metal nitride, and the gate conductive layer may include a metal. The second blocking layer 570 may include a metal oxide, e.g., aluminum oxide, hafnium oxide, etc.

The gate electrode layer may be partially removed to form a gate electrode in each of the second gaps 560. In example embodiments, the gate electrode layer may be partially removed by a wet etching process. As a result, the fourth sacrificial pattern 325 in the mold having a staircase shape including the fourth sacrificial pattern 325 and the first insulation pattern 315 as a step may be replaced with the gate electrode and the second blocking layer 570 covering lower and upper surfaces of the gate electrode.

As illustrated above, the second distance d2 that is the distance in the third direction D3 between the second opening 460 and the etch stop structure 527 may be equal to or less than the first distance d1 that is half the distance between the second and third openings 460 and 465. Thus, in a deposition process for forming the gate electrode layer by providing deposition gas through the second and third openings 460 and 465, even though the deposition gas is provided in one direction through the second opening 460, the gate electrode layer may be well deposited in each of the second gaps 560 between the second opening 460 and the etch stop structure 527, and void may be rarely formed therein.

If the second distance d2 is considerably greater than the first distance d1, during the deposition process, void may be formed in a portion of the gate electrode layer in the second gaps 560 between the second opening 460 and the etch stop structure 527, and the void may be exposed when the gate electrode layer is partially removed by an etching process. Further, the first insulation patterns 315 on and beneath the second gaps 560 may be also removed through the exposed void, so that electrical short may be generated between lower and upper gate electrodes.

However, in example embodiments, the second distance d2 between the second opening 460 and the etch stop structure 527 may be equal to or less than the first distance d1 that is half the distance between the second and third openings 460 and 465, and thus void may not be formed in the portion of the gate electrode layer filling the second gaps 560 between the second opening 460 and the etch stop structure 527, so that the electrical short between lower and upper gate electrodes may be reduced or prevented.

In example embodiments, the gate electrode may extend in the second direction D2, and a plurality of gate electrodes may be formed in the first direction D1 to form a gate electrode structure. The gate electrode structure may have a staircase shape including step layers of the gate electrodes. An end portion in the second direction D2 of each of the gate electrodes that may not be overlapped by upper gate electrodes in the first direction D1, that is, a portion of each of the gate electrodes corresponding to a step of the step layers may be referred to as a pad. The gate electrode structure may include first pads having a relatively short length in the second direction D2 and second pads having a relatively large length in the second direction D2, and the number of the first and second pads may not be limited.

Additionally, a plurality of gate electrode structures may be formed in the third direction D3, and may be spaced apart from each other by the second openings 460. As illustrated above, the third openings 465 may not extend to end portions of the gate electrode structure in the second direction D2, and may be spaced apart from each other in the second direction D2, and thus the gate electrode structure may not be divided by the third openings 465. However, a lowermost one of the gate electrodes in the gate electrode structure may be divided in the third direction D3 by the third openings 465 and the first division pattern 330, and ones of the gate electrodes in the gate electrode structure at upper two levels, respectively, may be divided in the third direction D3 by the third opening 365 and by the second division pattern 440.

The gate electrode structure may include first, second and third gate electrodes 752, 754 and 756 sequentially stacked in the first direction D1. In example embodiments, the first gate electrode 752 may be formed at a lowermost level, and may serve as a ground selection line (GSL). The third gate electrode 756 may be formed at an uppermost level and a second level from above, and may serve as a string selection line (SSL). The second gate electrode 754 may be formed at a plurality of levels between the first and third gate electrodes 752 and 756, and may serve as a word line.

In example embodiments, each memory block between ones of the second openings 460 neighboring in the second direction D2 may include two GSLs at each level, one word line at each level, and four SSLs at each level.

Figure 24:
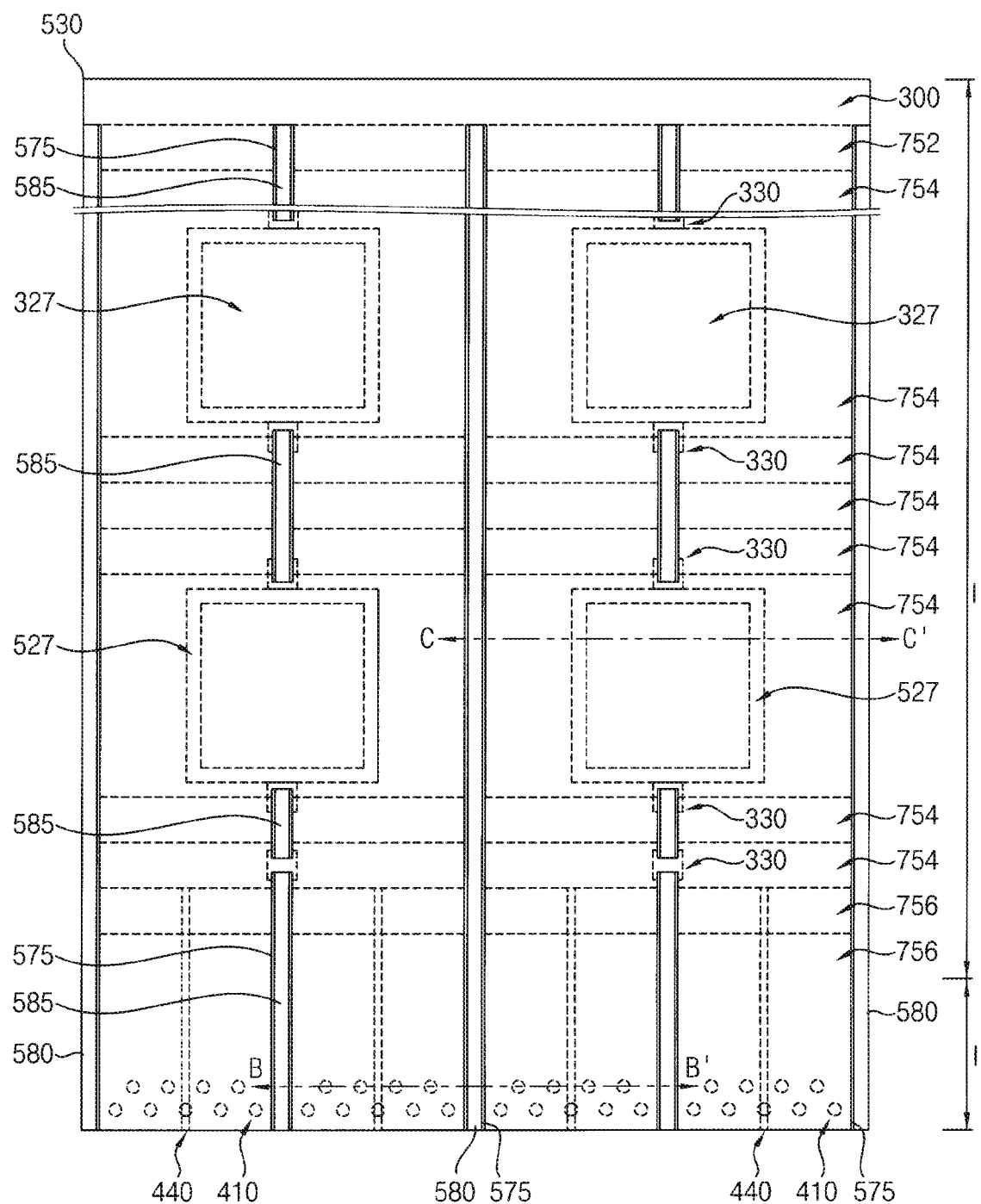
Figure 25:
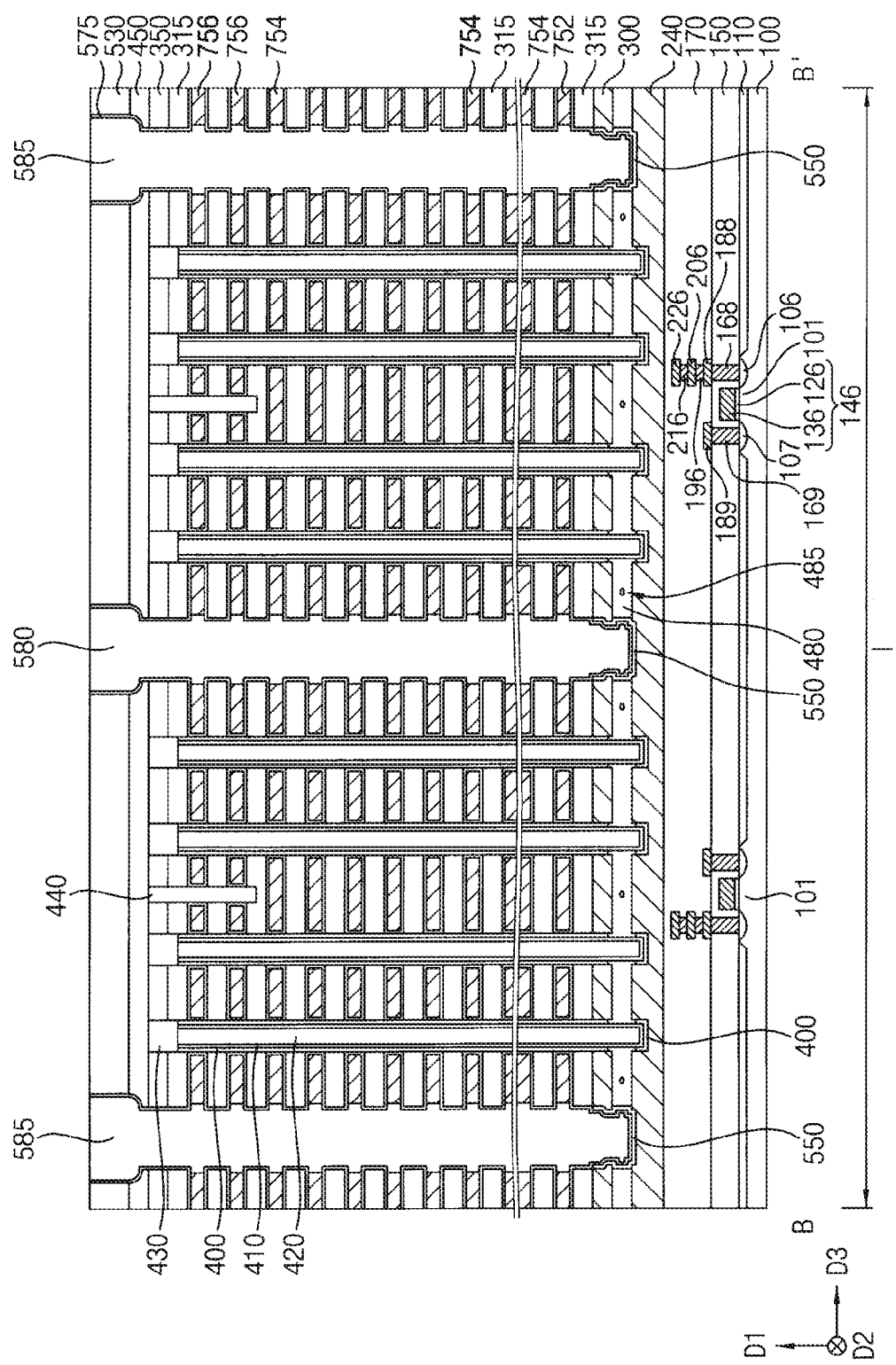
Figure 26:
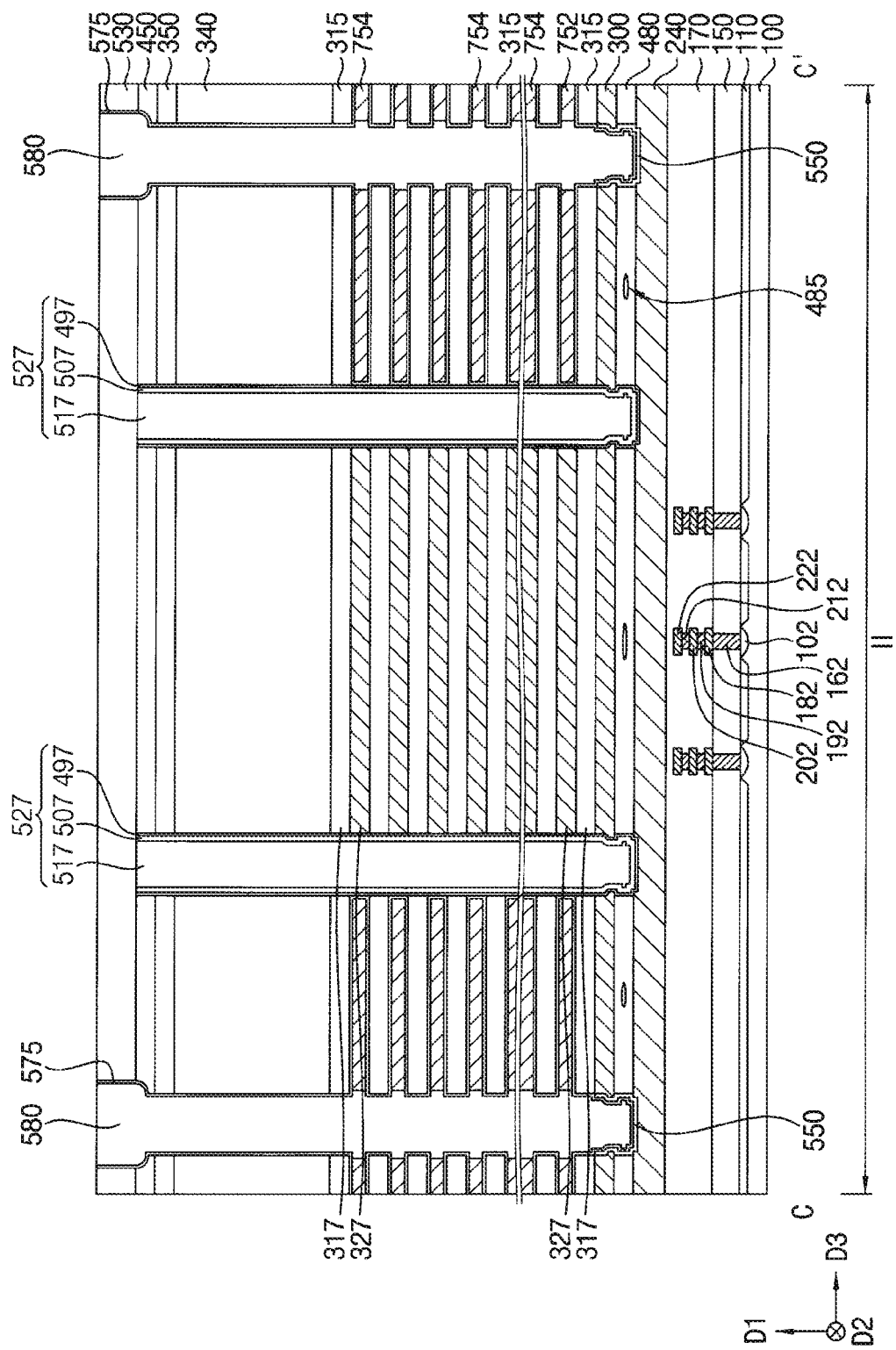

Referring to FIGS. 24 to 26, a third division pattern 580 filling the second and fifth openings 460 and 540, and a fourth division pattern 585 filling the third and sixth openings 465 and 545 may be formed on the second blocking layer 570, and may be planarized until an upper surface of the second support layer 530 is exposed. Thus, the second blocking layer 570 may be transformed into a second blocking pattern 575.

The third and fourth division patterns 580 and 585 may include an oxide, e.g., silicon oxide.

Figure 27:
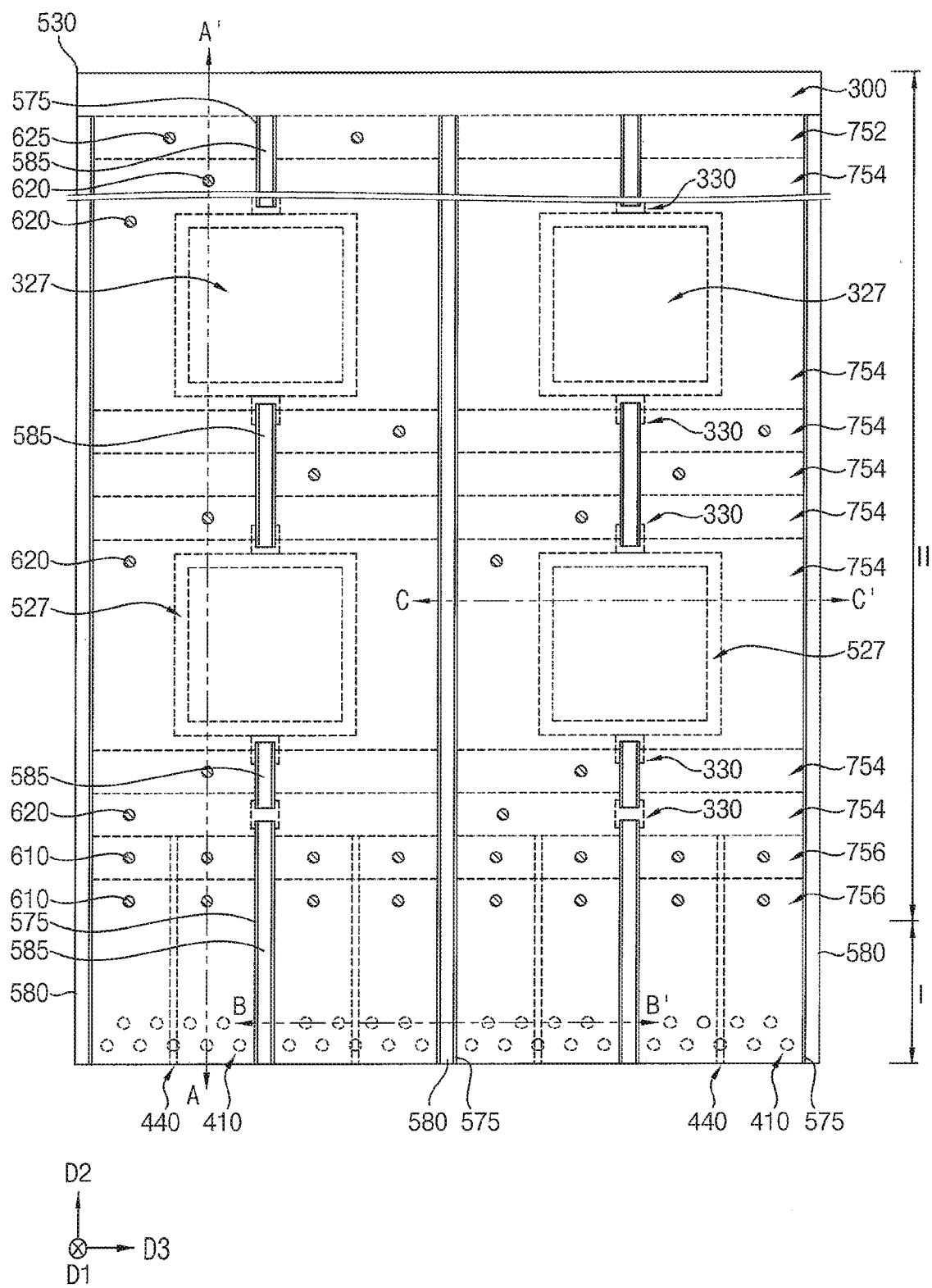
Figure 28A:
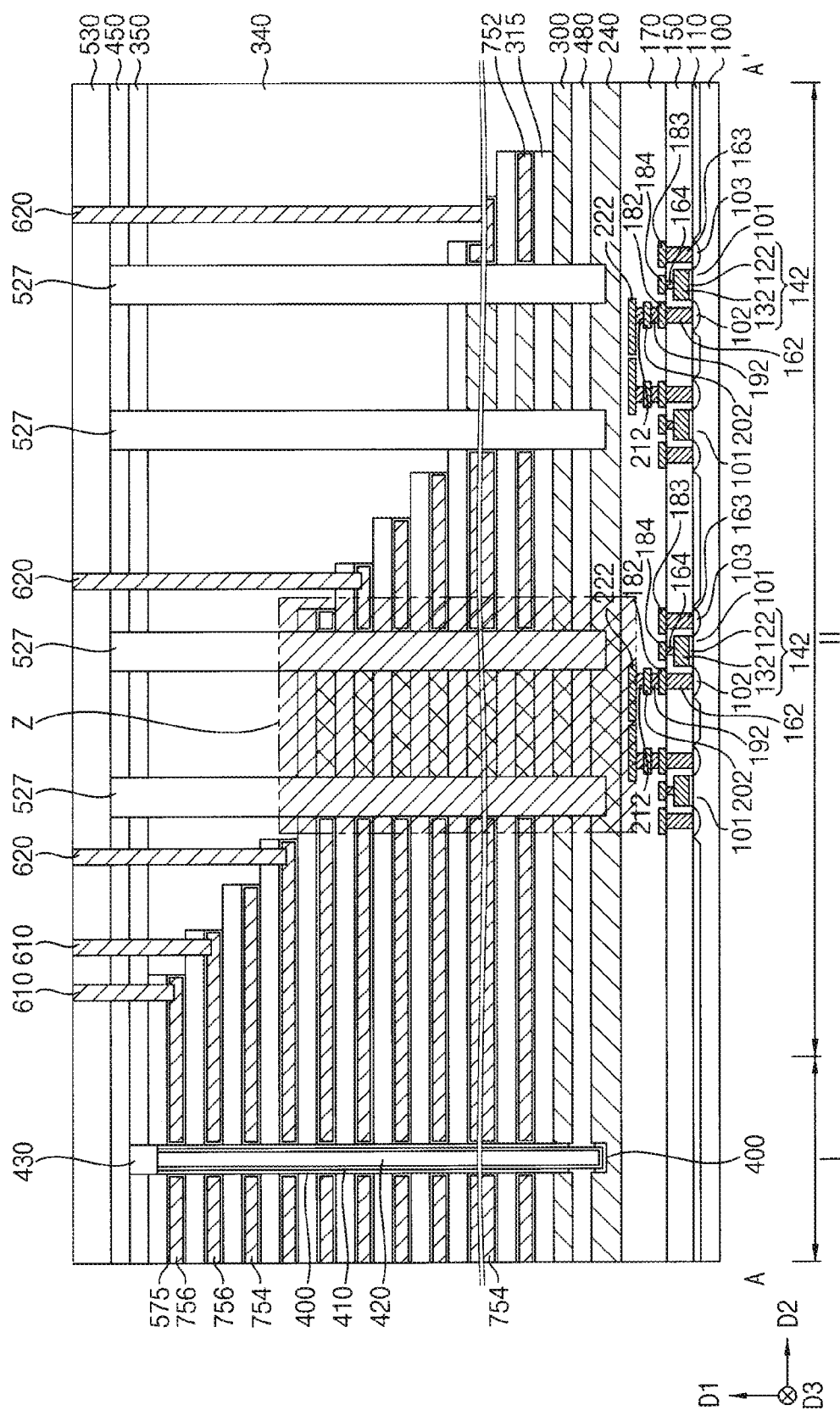
Figure 28B:
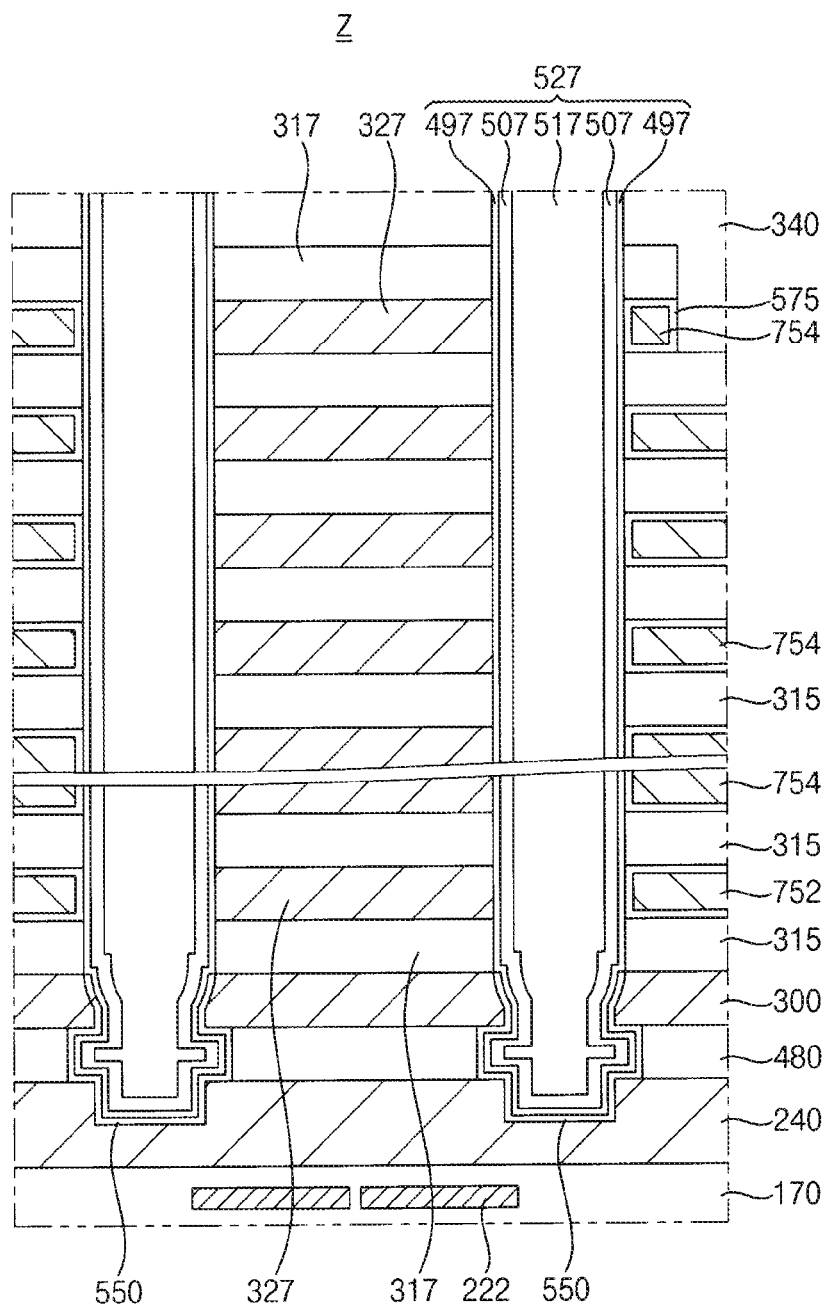

Referring to FIGS. 27, 28A and 28B, first to third upper contact plugs 610, 620 and 625 may be formed through the second support layer 530, the third to fifth insulating interlayers 340, 350 and 450, and the first insulation pattern 315 on the second region II of the substrate 100.

The first to third contact plugs 610, 620 and 625 may contact pads of the third, second and first gate electrodes 756, 754 and 752, respectively. FIG. 27 shows a layout of the first to third upper contact plugs 610, 620 and 625, however, the inventive concepts may not be limited thereto.

Figure 29:
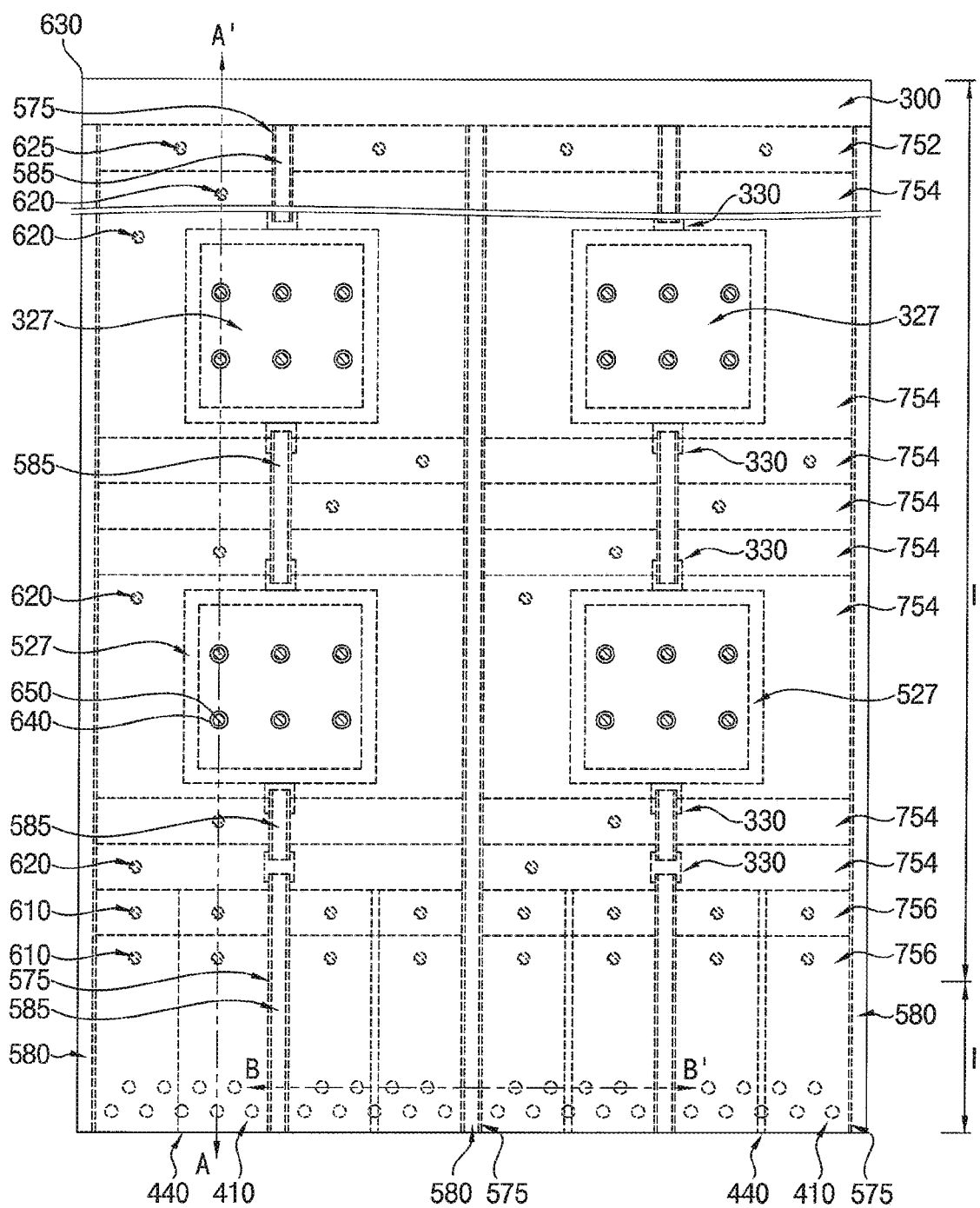
Figure 30A:
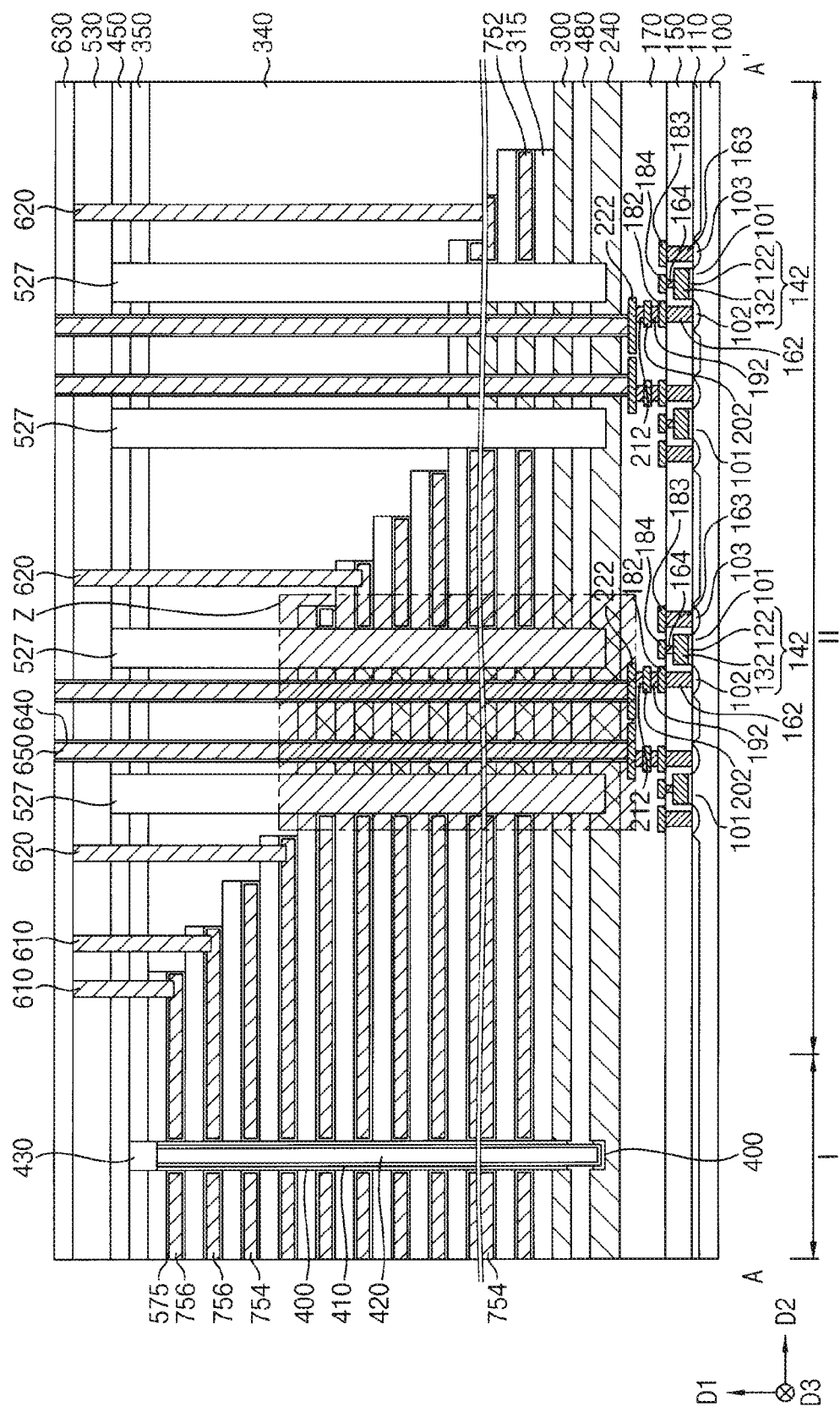
Figure 30B:
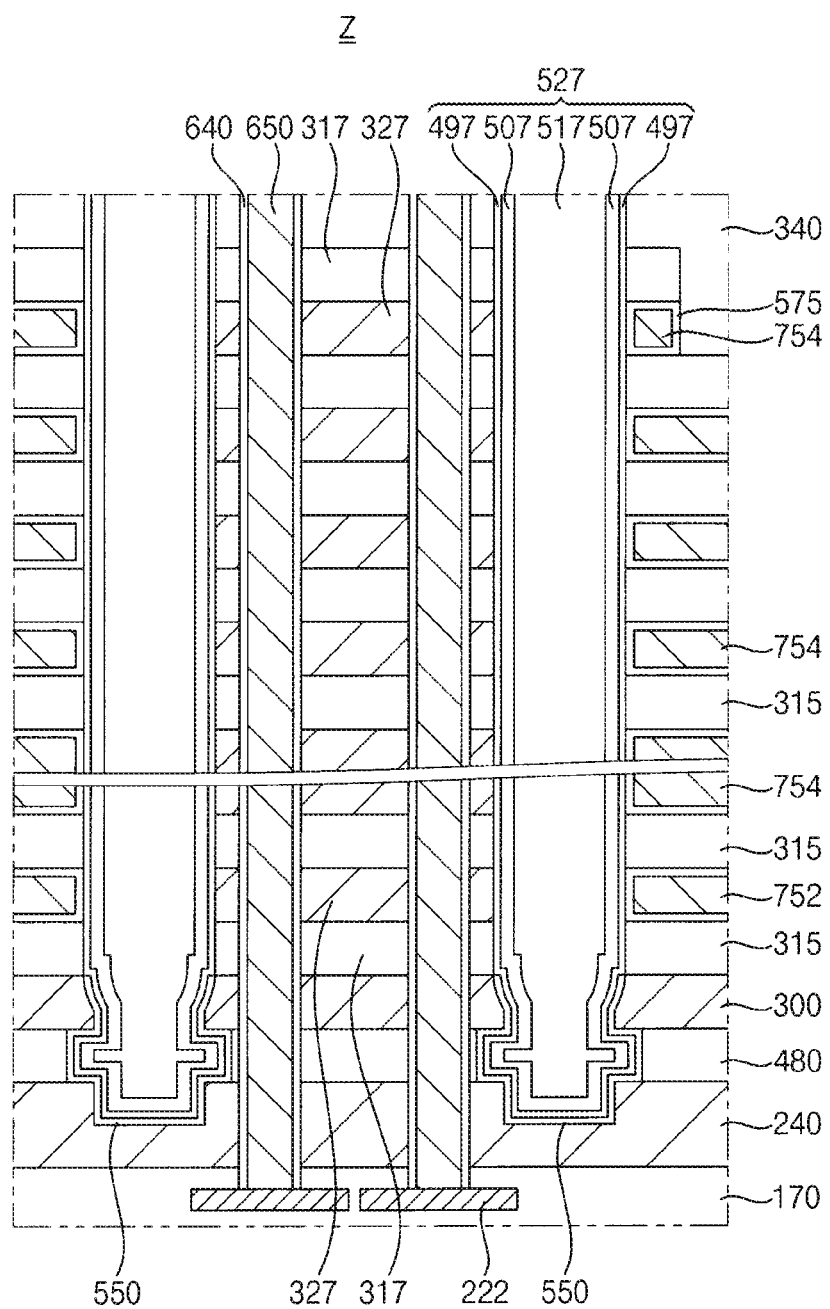

Referring to FIGS. 29, 30A and 30B, a sixth insulating interlayer 630 may be formed on the second support layer 530 and the first to third upper contact plugs 610, 620 and 625, and a through via 650 may be formed through the second and third insulation patterns 317 and 327, the first support layer 300, the channel connection pattern 480, the CSP 240, and an upper portion of the second insulating interlayer 170 surrounded by the etch stop structure 527 to contact an upper surface of the eighth lower wiring 222 on the second region II of the substrate 100.

In example embodiments, a plurality of through vias 650 may be spaced apart from each other in an area surrounded by the etch stop structure 527. In the drawings, six through vias 650 are shown in each area, however, the inventive concepts may not be limited thereto.

A fourth insulation pattern 640 may be formed on a sidewall of the through via 650, and thus may be electrically insulated from the first support layer 300, the channel connection pattern 480 and the CSP 240. However, the through via 650 may extend through the insulation pattern structure surrounded by the etch stop structure 527, that is, the second and third insulation patterns 317 and 327 to be electrically insulated from the first to third gate electrodes 752, 754 and 756, and thus, if an insulation pattern is formed on sidewalls of the first support layer 300, the channel connection pattern 480 and the CSP 240, the fourth insulation pattern 640 may not be formed.

The first to third contact plugs 610, 620 and 625 and the through via 650 may include, e.g., a metal, a metal nitride, a metal silicide, etc., and the fourth insulation pattern 640 may include an oxide, e.g., silicon oxide.

A common source contact plug (not shown) may be further formed on a portion of the first support layer 300 not covered by the gate electrode structure.

Figure 31:
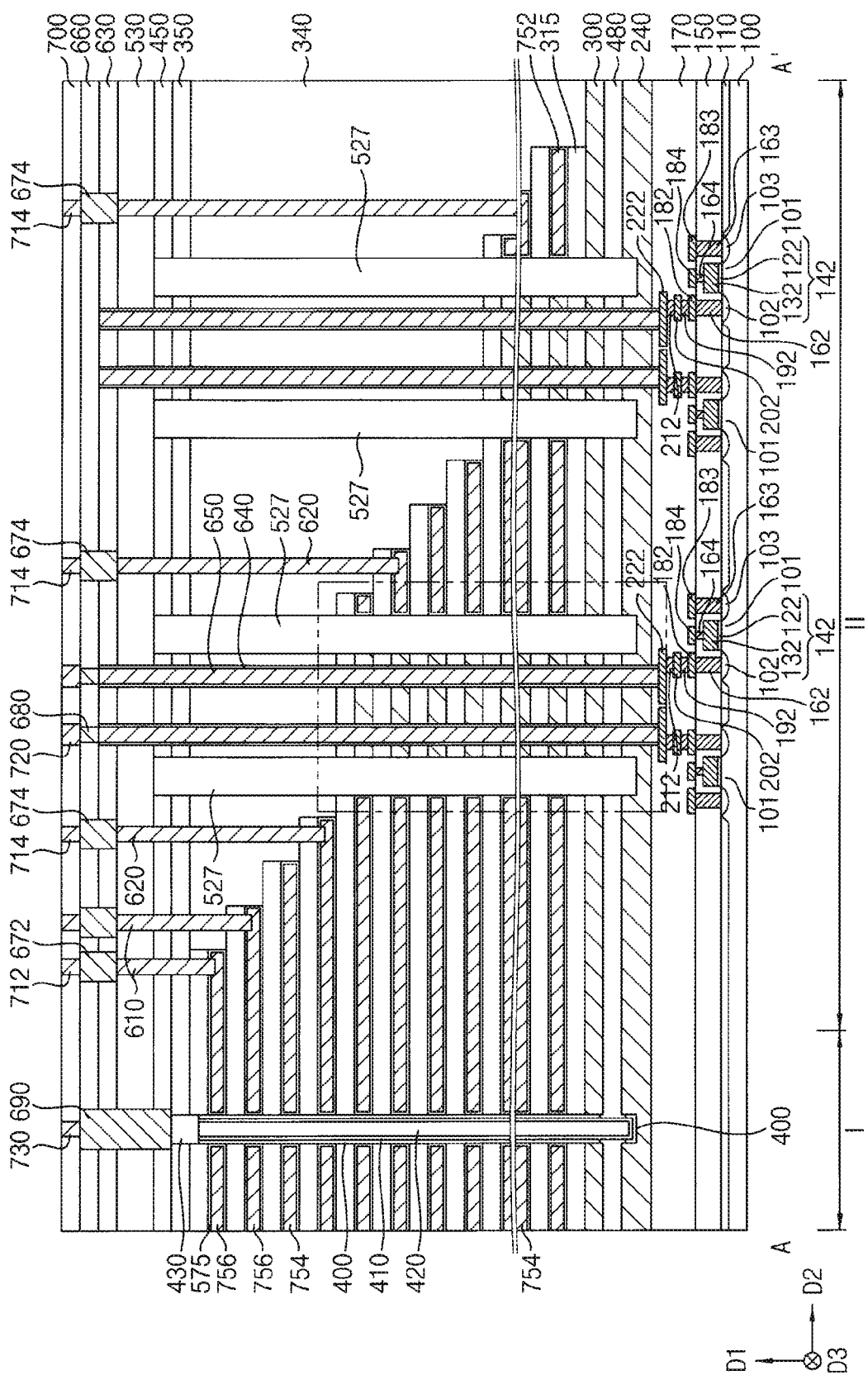
Figure 32:
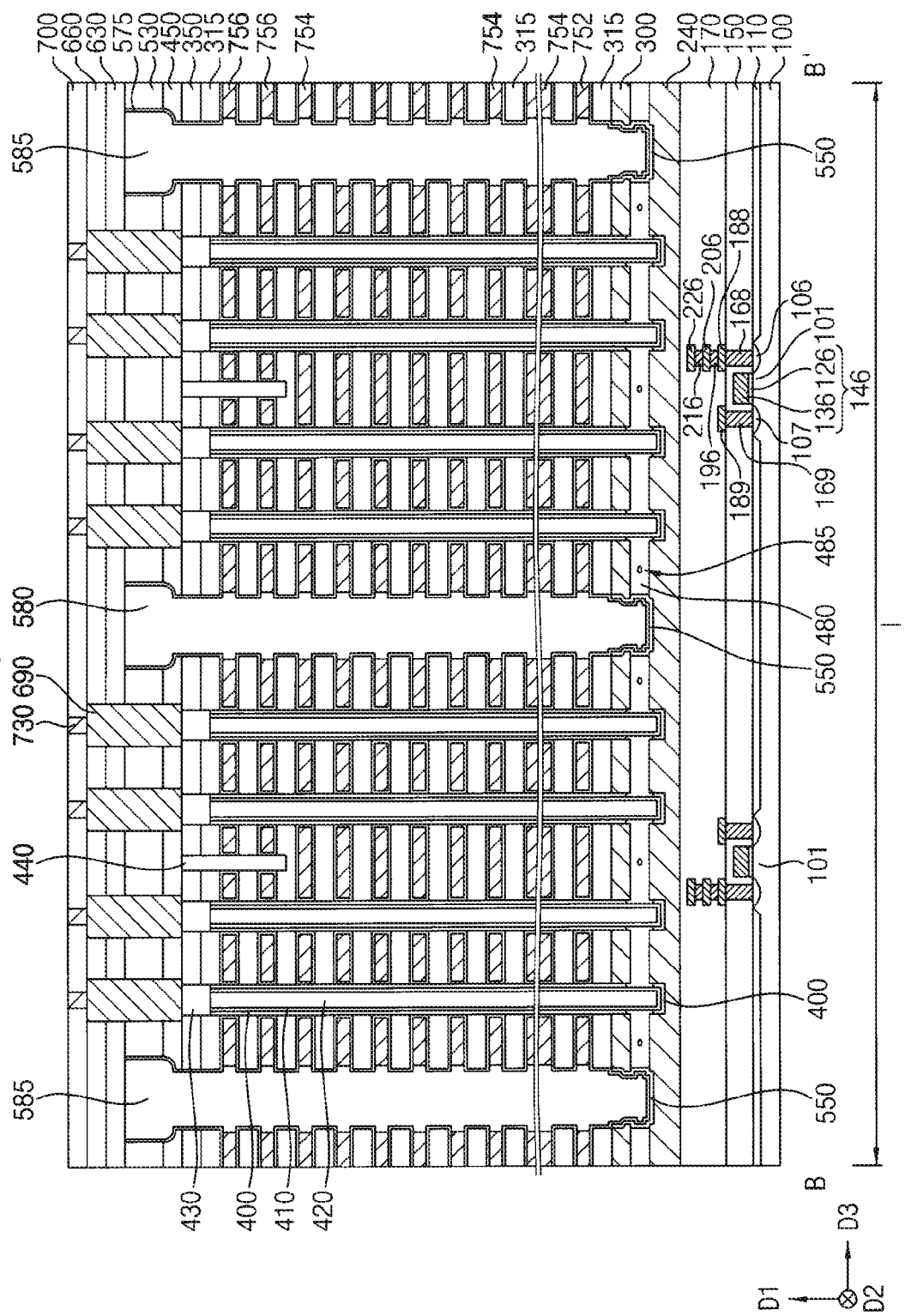
Figure 33:
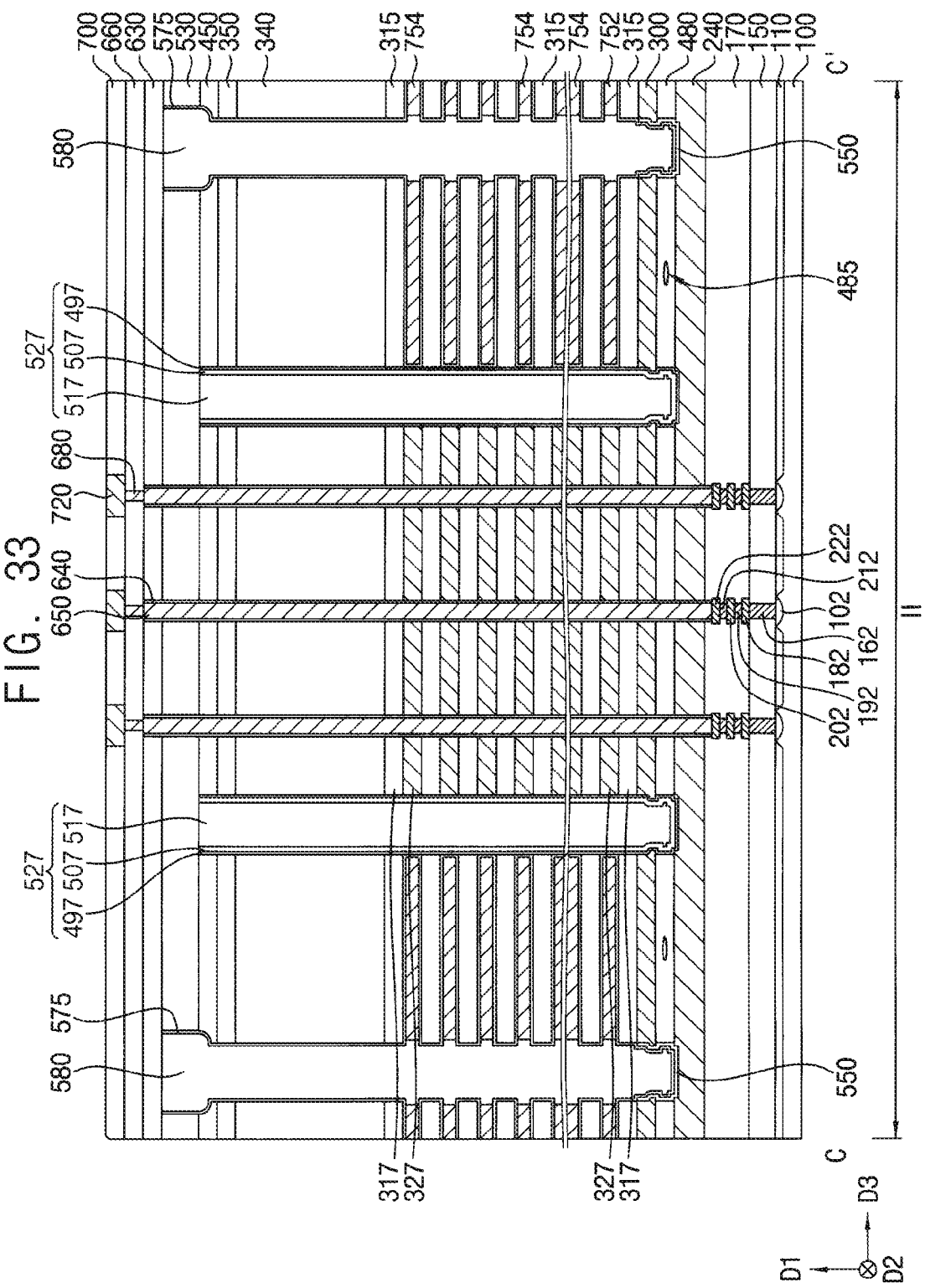

Referring to FIGS. 31 to 33, a seventh insulating interlayer 660 may be formed on the sixth insulating interlayer 630, the fourth insulation pattern 640 and the through via 650, and fourth and fifth upper contact plugs 672 and 674, a sixth upper contact plug (not shown), and seventh and eighth upper contact plugs 680 and 690 may be formed.

The fourth and fifth upper contact plugs 672 and 674 and the sixth upper contact plug may extend through the sixth and seventh insulating interlayers 630 and 660 to contact upper surfaces of the first to third upper contact plugs 610, 620 and 625, respectively, the seventh upper contact plug 680 may extend through the seventh insulating interlayer 660 to contact an upper surface of the through via 650, and the eighth upper contact plug 690 may extend through the second support layer 530 and the fifth to seventh insulating interlayers 450, 630 and 660 to contact an upper surface of the capping pattern 430.

An eighth insulating interlayer 700 may be formed on the seventh insulating interlayer 660, the fourth and fifth upper contact plugs 672 and 674, the sixth upper contact plug, and the seventh and eighth upper contact plugs 680 and 690, and first and second upper wirings 712 and 714, a third upper wiring (not shown), and fourth and fifth upper wirings 720 and 730 may be formed.

The first and second upper wirings 712 and 714 may contact upper surfaces of the fourth and fifth upper contact plugs 672 and 674, respectively, the third upper wiring may contact an upper surface of the sixth upper contact plug, and the fourth and fifth upper wirings 720 and 730 may contact upper surfaces of the seventh and eighth upper contact plugs 680 and 690, respectively.

In example embodiments, the fifth upper wiring 730 may extend in the third direction D3, and a plurality of fifth upper wirings 730 may be formed in the second direction D2 to serve as bit lines, respectively. Alternatively, an upper via (not shown) and a sixth upper wiring (not shown) may be further formed on the fifth upper wiring 730, and the sixth upper wiring may serve as a bit line.

The first and second upper wirings 712 and 714, the third upper wiring, and the fourth upper wiring 720 may be formed to have various layouts on the second region II of the substrate 100.

The vertical memory device may be manufactured by the above processes.

As illustrated above, the through via 650 electrically connected to the lower circuit pattern and extending through the gate electrode structure may extend through a corresponding one of the second pads of the gate electrode structure and extend through the insulation pattern structure surrounded by the etch stop structure 527 having a closed ring shape in a plan view. The etch stop structure 527 may be formed in the fourth opening 467 that may be formed to together with the second and third openings 460 and 465 for replacing the fourth sacrificial patterns 325 with the gate electrodes, respectively, and may include the third etch stop pattern 497, the fourth spacer 507 and the second filling pattern 517 sequentially stacked on a sidewall and a bottom of the fourth opening 467.

The second distance d2 between the etch stop structure 527 and the second opening 460 may be equal to or less than the first distance d2 that may be half the distance between the second and third openings 460 and 465, and thus the portion of the fourth sacrificial patterns 325 between the etch stop structure 527 and the second opening 460 may be easily removed, and the gate electrode layer may be formed to have no void in the second gap 560. Accordingly, when the gate electrode layer is etched to form the gate electrode, the first insulation patterns 315 on and beneath the gate electrode layer may not be etched, and the electrical short between upper and lower gate electrodes may be reduced or prevented.

The vertical memory device manufactured by the above processes may have structural characteristics, as follows.

Referring to FIGS. 29 to 33, the vertical memory device may include the lower circuit pattern on the substrate 100 including the first region I and the second region II at least partially surrounding the first region I, the CSP 240 on the lower circuit pattern, the gate electrode structure including the gate electrodes 752, 754 and 756 spaced apart from each other in the first direction D1 on the CSP 240, each of which may extend in the second direction D2 on the first and second regions I and II of the substrate 100, and sequentially stacked in a staircase shape, the channels 410 each of which may extend through the gate electrode structure in the first direction D1 on the CSP 240 on the first region I of the substrate 100, the charge storage structure on the sidewall of each of the channels 410, the insulation pattern structure extending through the gate electrode structure on the second region II of the substrate 100, the etch stop structure 527 extending through the gate electrode structure to surround at least a portion of the sidewall of the insulation pattern structure, the through via 650 extending through the insulation pattern structure and the CSP 240 in the first direction D1 to be electrically connected to the lower circuit pattern, the third division patterns 580 each of which may extend in the second direction D2 on the first and second regions I and II of the substrate 100, the fourth division patterns 585, each of which may extend through the gate electrode structure between the third division pattern s 580, spaced apart from each other in the second direction D2, and the second support layer 530 covering an upper surface of the etch stop structure 527 to contact an upper sidewall of each of the third and fourth division patterns 580 and 585. Each of the third division patterns 580 may be spaced apart from the etch stop structure 527 in the third direction D3, and each of the fourth division patterns 585 may be spaced apart from the etch stop structure 527 in the second direction D2.

In example embodiments, the second distance d2 from the third division pattern 580 to the etch stop structure 527 in the second direction D2 may be equal to or less than the first distance d1 that is half the distance between neighboring ones of the second and third division patterns 580 and 585 in the second direction D2.

In example embodiments, the second blocking pattern 575 including a metal oxide may be formed on a sidewall of each of the third and fourth division patterns 580 and 585.

In example embodiments, an upper surface of each of the third and fourth division patterns 580 and 585 may be higher than an upper surface of the etch stop structure 527. Each of the third and fourth division patterns 580 and 585 may include lower and upper portions sequentially stacked, and an upper surface of the lower portion of each of the third and fourth division patterns 580 and 585 may be substantially coplanar with the upper surface of the etch stop structure 527. A lower surface of each of the third and fourth division patterns 580 and 585 may be substantially coplanar with a lower surface of the etch stop structure 527.

In example embodiments, the vertical memory device may further include the first division pattern 330 contacting a sidewall of the first gate electrode 752 at a lowermost level in the gate electrode structure, and overlapping in the first direction D1 a portion of the gate electrode structure between neighboring ones of the fourth division patterns 585 spaced apart from each other in the second direction D2. Additionally, the vertical memory device may include the second division pattern 440 extending in the second direction D2 between the third and fourth division patterns 580 and 585 and extending through the third gate electrodes 756 at upper two levels, respectively, of the gate electrode structure. An upper surface of the second division pattern 440 may be lower than the upper surface of the etch stop structure 527.

In example embodiments, the etch stop structure 527 may include a plurality of patterns including different materials from each other. For example, the etch stop structure 527 may include the filling pattern 517, the fourth spacer 507 covering a sidewall and a bottom of the filling pattern 517, and the third etch stop pattern 497 covering a sidewall and a bottom of the fourth spacer 507. The filling pattern 517 may include, e.g., polysilicon or an oxide, the fourth spacer 507 may include, e.g., a nitride, and the third etch stop pattern 497 may include, e.g., an oxide.

In example embodiments, the etch stop structure 527 may have a closed ring shape in a plan view, e.g., a rectangular ring shape.

In example embodiments, the first insulation patterns 315 may be formed between neighboring ones of the first to third gate electrodes 752, 754 and 756 spaced apart from each other in the first direction D1, so as to electrically insulate the first to third gate electrodes 752, 754 and 756.

In example embodiments, the insulation pattern structure may include the second and third insulation patterns 317 and 327 alternately and repeatedly stacked in the first direction D1. Each of the second insulation patterns 317 may include an oxide, and each of the third insulation patterns 327 may include a nitride. The second insulation patterns 317 may be formed at the same levels as corresponding ones of the first insulation patterns 315, respectively.

In example embodiments, the gate electrodes 752, 754 and 756 may be stacked in a staircase shape on the second region II of the substrate 100, and each of the gate electrodes 752, 754 and 756 may include the pad not being overlapped by upper gate electrodes in the first direction D1 on the second region II of the substrate 100. The pads of the gate electrodes 752, 754 and 756 may include the first pad having a relatively short length in the second direction D2 and the second pad having a relatively long length in the second direction D2, and the etch stop structure 527 and the insulation pattern structure may extend through the second pad. The gate electrode structure may include a plurality of second pads spaced apart from each other in the second direction D2, and a plurality of etch stop structures 527 may be formed to be spaced apart from each other in the second direction.

In example embodiments, the third division pattern 580 may continuously extend in the second direction D2 on the first and second regions I and II of the substrate 100, each of the second and fourth division patterns 440 and 585 may continuously extend in the second direction D2 at least on the first region I of the substrate 100, and the first division pattern 330 may be formed on the second region II of the substrate 100.

Figure 34:
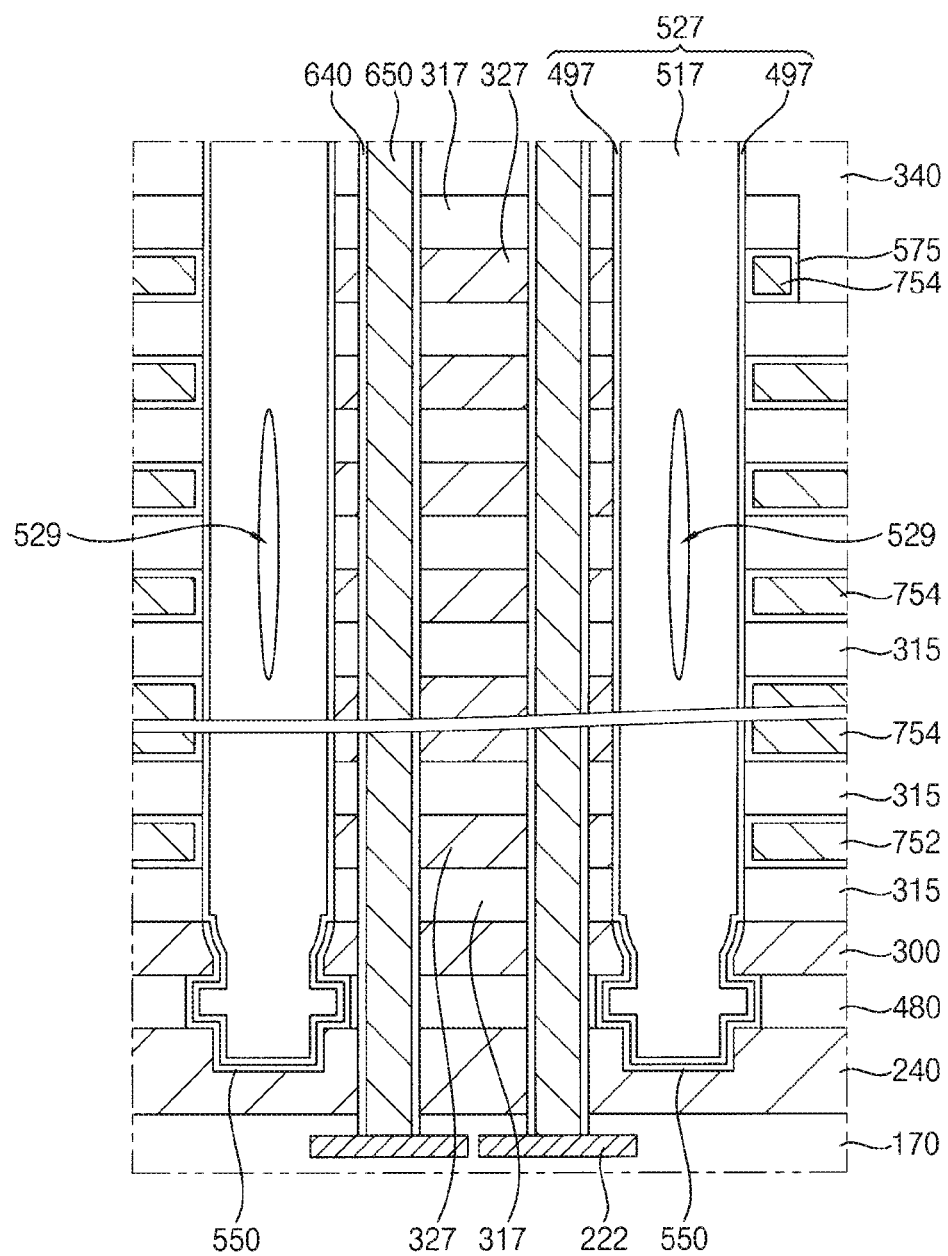
FIG. 34 is a cross-sectional view illustrating an etch stop structure of a vertical memory device in accordance with example embodiments.

FIG. 34 is a cross-sectional view illustrating an etch stop structure of a vertical memory device in accordance with example embodiments. The etch stop structure may be different from those of FIGS. 30A and 30B in some elements, which will be explained.

Referring to FIG. 34, the etch stop structure 527 may include the third etch stop pattern 497 and the second filling pattern 517, and may not include the fourth spacer 507.

However, the second filling pattern 517 may include polysilicon, or a nitride such as silicon nitride.

As illustrated with reference to FIGS. 19 to 21, the etch stop structure 527 may necessarily include the third etch stop pattern 497 including a material that may not be easily etched by the etching solution provided from the second and third openings 460 and 465, e.g., silicon oxide, however, a remaining portion of the fourth opening 467 may be filled with not only a plurality of layers but also a single layer.

A void 529 may be formed in the etch stop structure 527.

Figure 35:
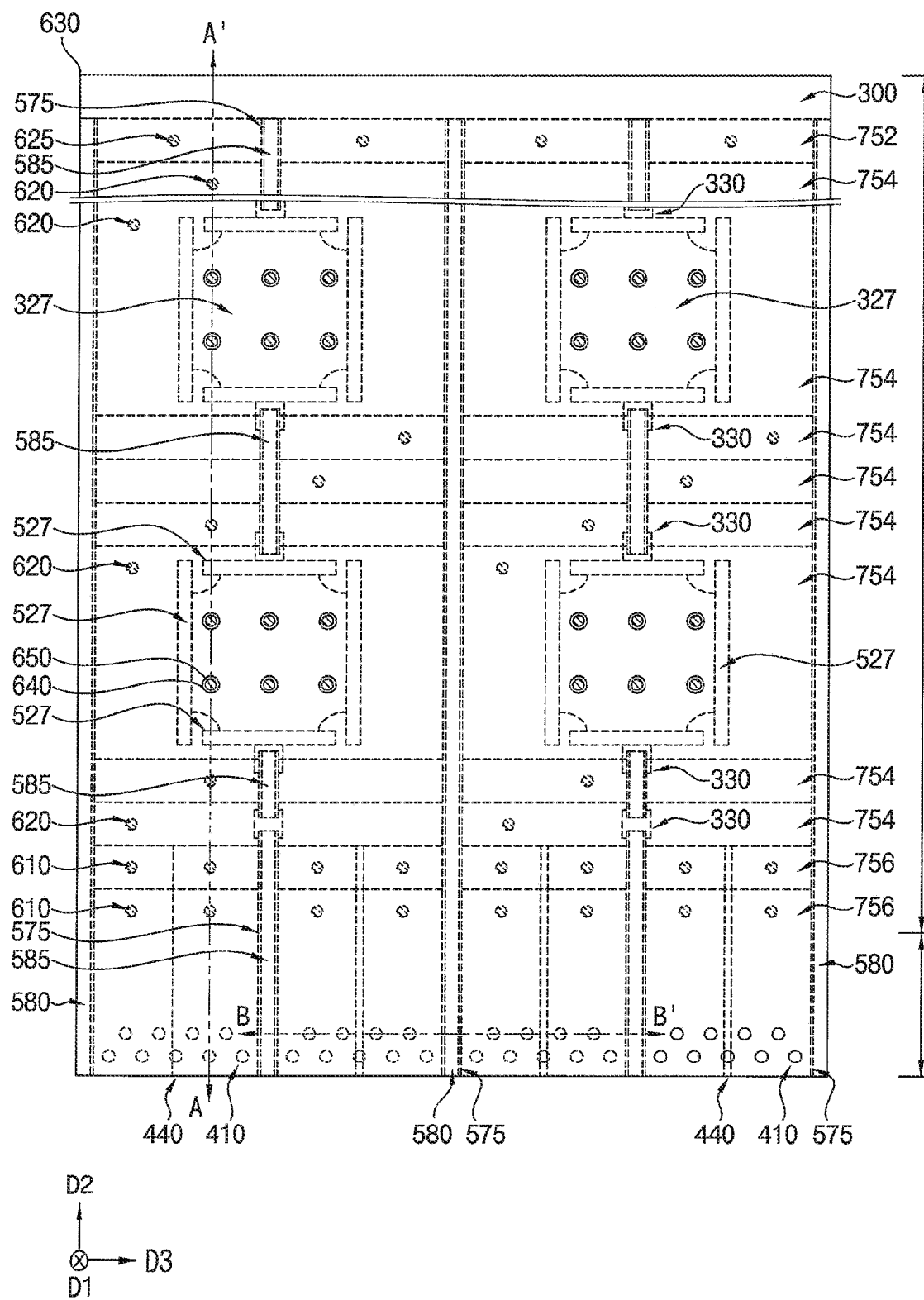
FIGS. 35 and 36 are plan views illustrating vertical memory devices in accordance with example embodiments.
Figure 36:
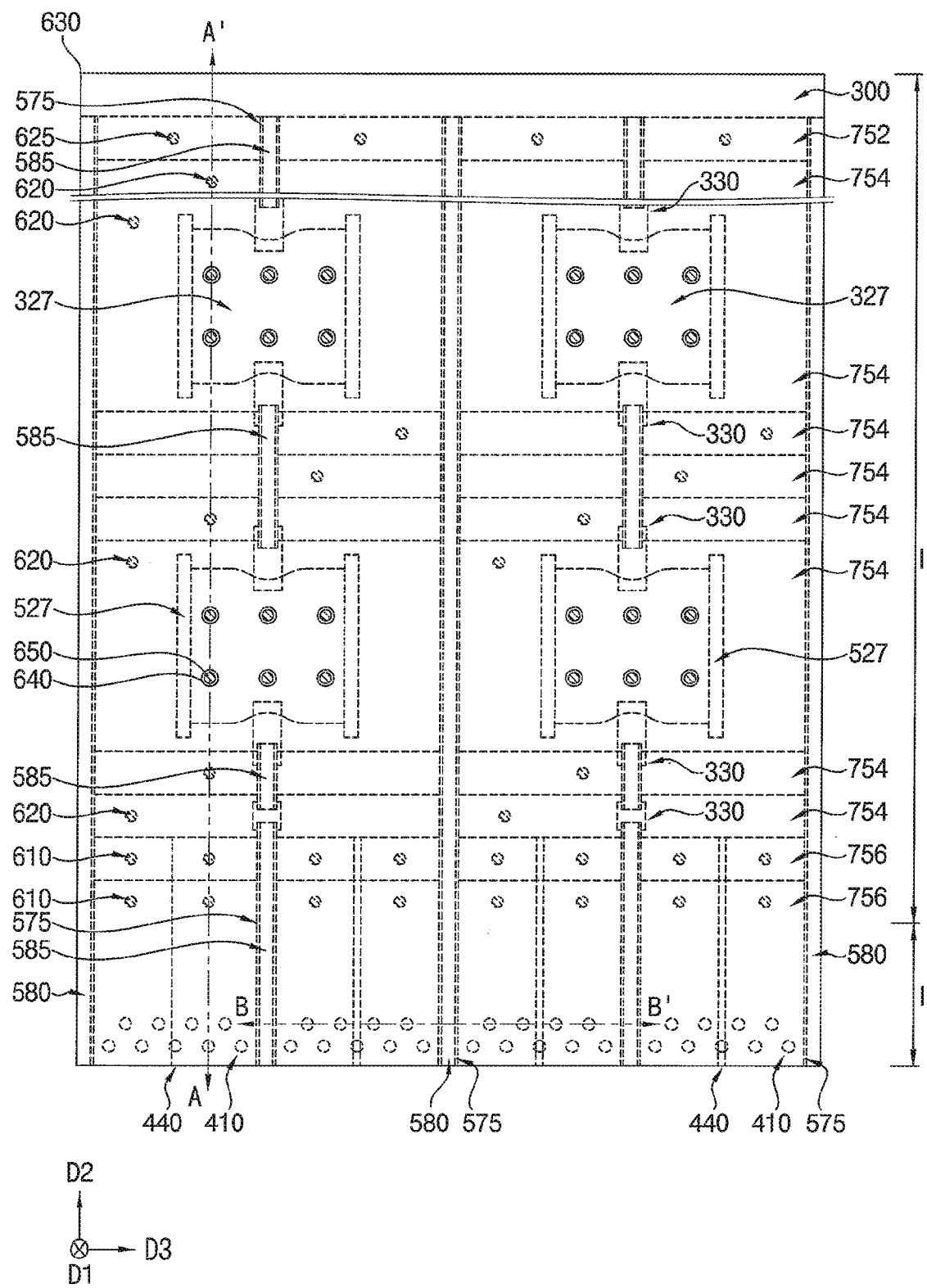

FIGS. 35 and 36 are plan views illustrating vertical memory devices in accordance with example embodiments. These vertical memory devices may be the same as or substantially the same as or similar to that of FIGS. 29 to 33, except for the shape of the etch stop structure.

Referring to FIG. 35, the etch stop structure 527 may not have a closed ring shape but a shape of which a portion is opened in a plan view. For example, the etch stop structure 527 may include first parts spaced apart from each other in the third direction D3, each of which may extend in the second direction D2, and second parts spaced apart from each other in the third direction D2, each of which may extend in the third direction D3. The first and second parts of the etch stop structure 527 may not contact each other but be spaced apart from each other.

However, a distance between the first and second parts of the etch stop structure 527 may be small, and thus, when the wet etching process illustrated with reference to FIGS. 19 to 21 is performed, an amount of the etching solution flowed into an area where the etch stop structure 527 is formed may be small. Accordingly, the fourth sacrificial layers 320 in the area where the etch stop structure 527 is formed may not be etched but remain as the third insulation patterns 327.

Referring to FIG. 36, the etch stop structure 527 may not have the close ring shape in a plan view, but may include only the first parts spaced apart from each other in the third direction D3, each of which may extend in the second direction D2.

Thus, when the wet etching process illustrated with reference to FIGS. 19 to 21 is performed, the etching solution may be flowed into an area between the first parts of the etch stop structure 527. However, an amount of the etching solution flowed into the area from the third openings 465 spaced apart therefrom in the second direction D2 may be less than an amount of the etching solution flowed into the area from the second openings 460 spaced apart therefrom in the third direction D3, and thus most of the fourth sacrificial layers 320 between the first parts of the etch stop structure 527 may not be etched but remain as the third insulation patterns 327.

Figure 37:
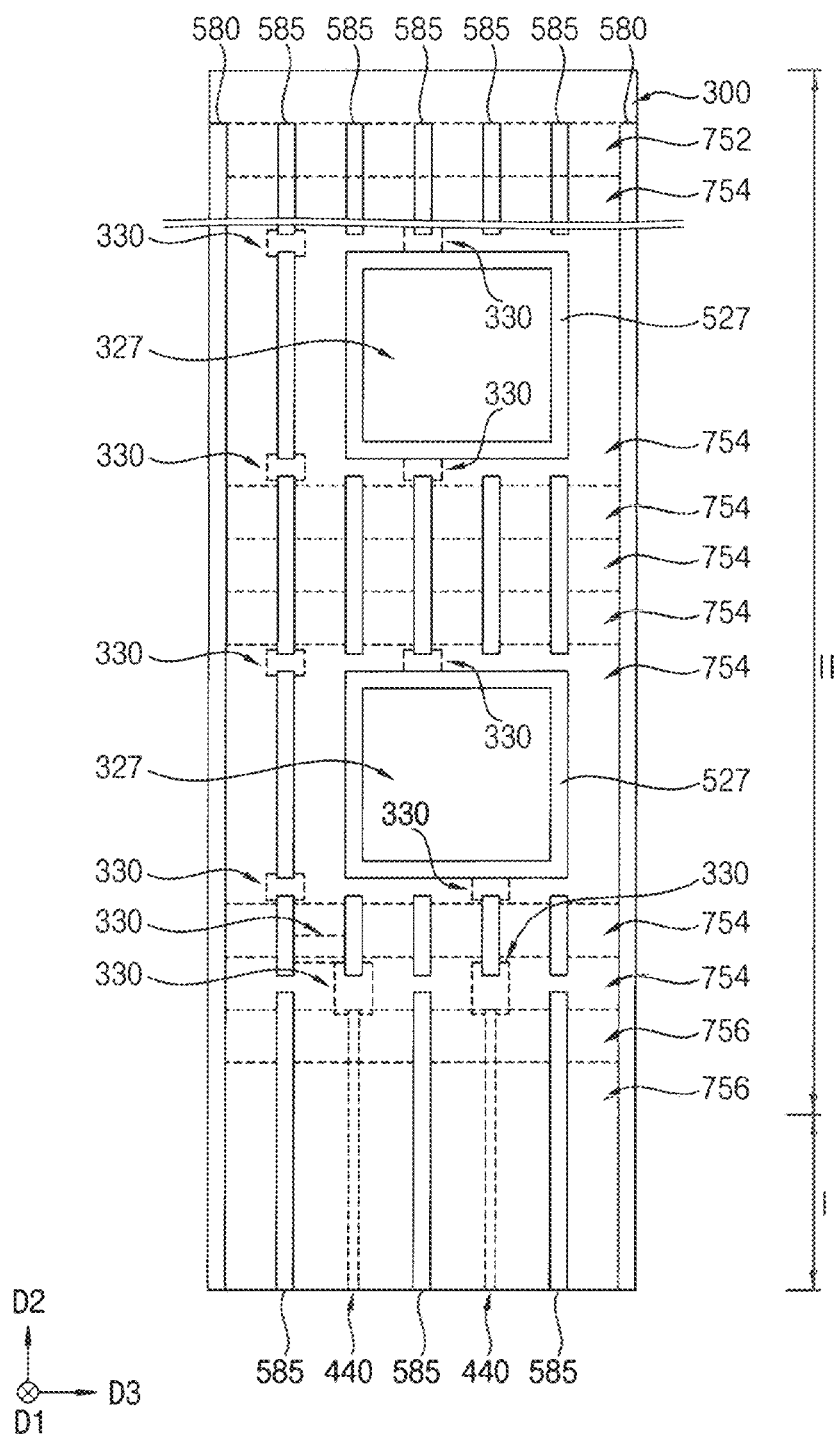
FIG. 37 is a plan view illustrating layouts of the etch stop structure, and the first to fourth division patterns of a vertical memory device in accordance with example embodiments, and shows an area corresponding to one memory block.

FIG. 37 is a plan view illustrating layouts of the etch stop structure, and the first to fourth division patterns of a vertical memory device in accordance with example embodiments, and shows an area corresponding to one memory block.

Referring to FIG. 37, the fourth division patterns 585 and the second division patterns 440, each of which may extend in the second direction D2, may be alternately disposed between the third division patterns 580 each of which may extend in the second direction D2 on the first region I of the substrate 100 and a portion of the second region II of the substrate 100 on which pads of the gate electrodes at upper two levels, respectively, of the gate electrode structure are formed.

The fourth division patterns 585 spaced apart from each other in the second direction D2 may be formed between the third division patterns 580, each of which may extend in the second direction D2, to form a fourth division pattern column on a portion of the second region II of the substrate 100 on which pads of the gate electrodes at other lower levels, respectively, of the gate electrode structure are formed. In example embodiments, a plurality of fourth division pattern columns may be spaced apart from each other in the third direction D3.

A second etch stop structure may extend through a portion of the second pad between the third division pattern 580 and the fourth division pattern 585 spaced apart from each other in the third direction D3, and may be disposed between the fourth division patterns 585 spaced apart from each other in the second direction D2.

The first division pattern 330 may be formed at a lowermost level of the gate electrode structure between the fourth division patterns 585 spaced apart from each other in the second direction D2 or the third direction D3, between the second division pattern 440 and the fourth division pattern 585 spaced apart from each other in the second direction D2, or between the fourth division pattern 585 and the etch stop structure 527 spaced apart from each other in the second direction D2, and may be at least partially overlapped in the first direction D1 therewith.

In the drawing, six SSLs, one word line, and three GSLs are shown at each level in one memory block, however, the inventive concepts may not be limited thereto.

Figure 38:
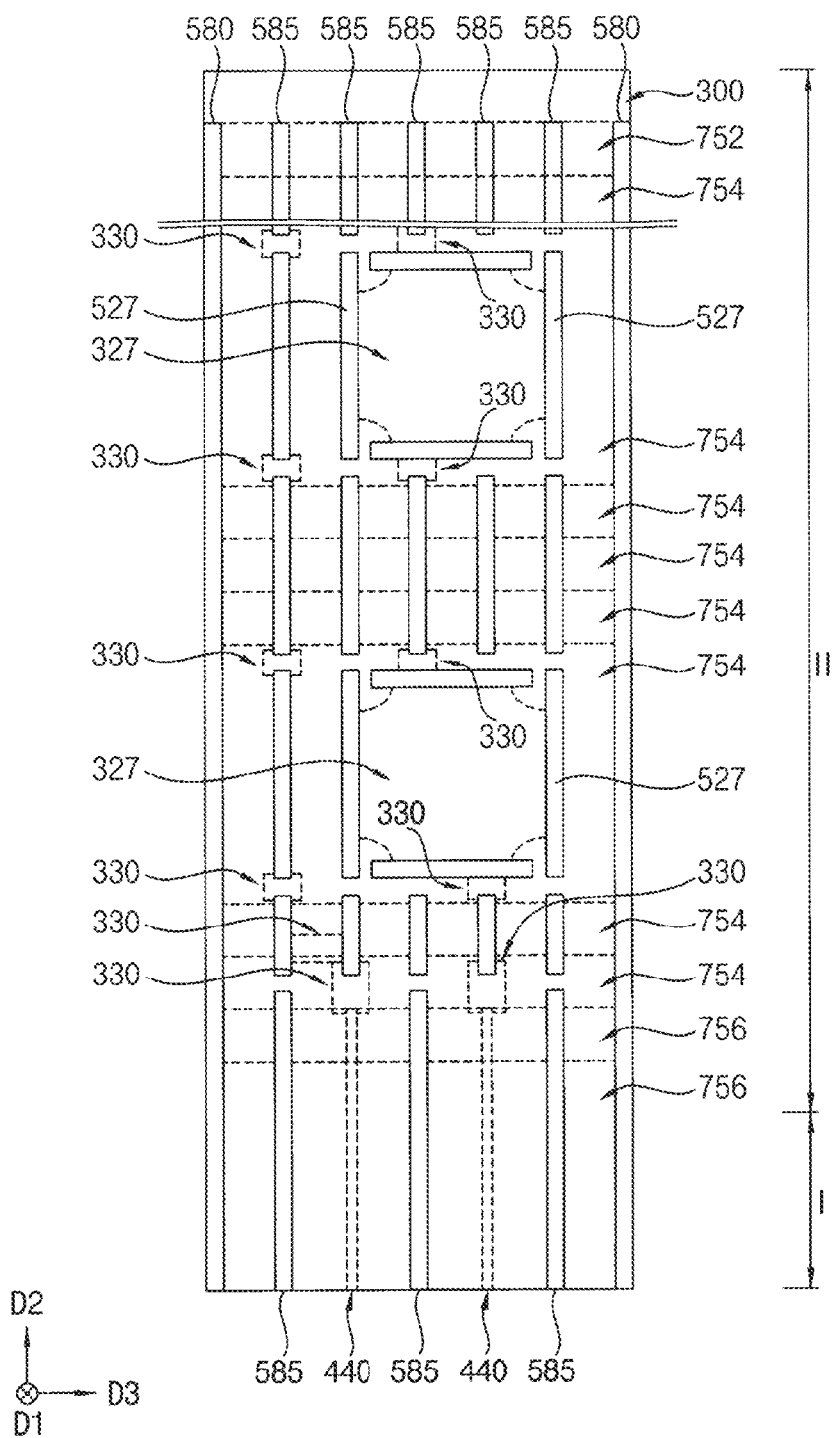
FIGS. 38 and 39 are plan views illustrating layouts of the etch stop structure, and the first to fourth division patterns of vertical memory devices in accordance with example embodiments.
Figure 39:
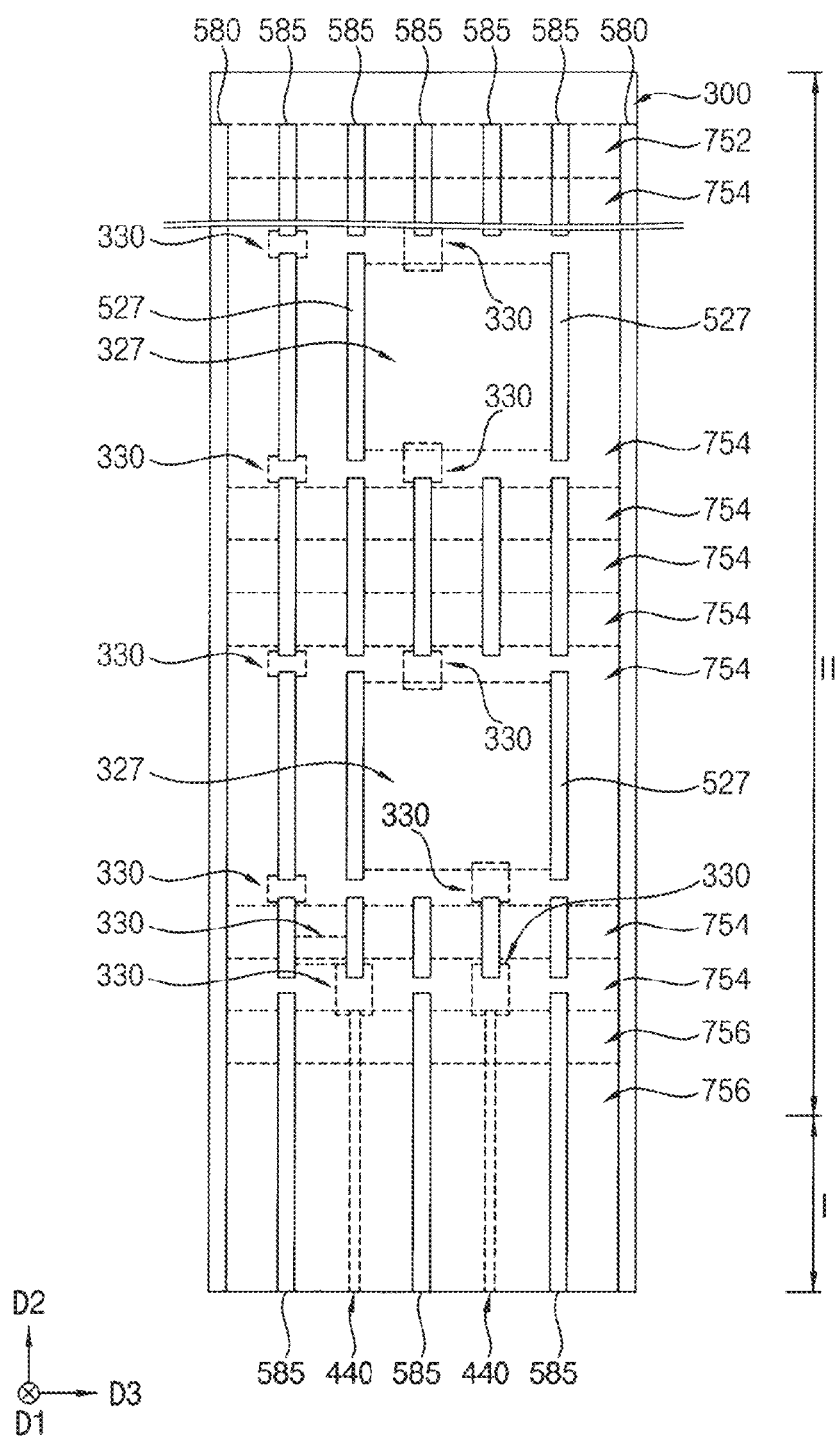

FIGS. 38 and 39 are plan views illustrating layouts of the etch stop structure, and the first to fourth division patterns of vertical memory devices in accordance with example embodiments. These vertical memory devices may be the same or substantially the same as or similar to that of FIG. 36, except for the shape of the etch stop structure.

Referring to FIG. 38, the etch stop structure 527 may not have a closed ring shape but a shape of which a portion is opened in a plan view. For example, the etch stop structure 527 may include first parts spaced apart from each other in the third direction D3, each of which may extend in the second direction D2, and second parts spaced apart from each other in the third direction D2, each of which may extend in the third direction D3. The first and second parts of the etch stop structure 527 may not contact each other but be spaced apart from each other.

Referring to FIG. 39, the etch stop structure 527 may not have a closed ring shape in a plan view, but may include first parts spaced apart from each other in the third direction D3, each of which may extend in the second direction D2.

While example embodiments have been particularly shown and described, it will be understood by one of ordinary skill in the art that variations in form and detail may be made therein without departing from the spirit and scope of the claims.

What is claimed is:

1. A vertical memory device comprising:
   a gate electrode structure including gate electrodes spaced apart from each other on a substrate in a first direction substantially perpendicular to an upper surface of the substrate, each of the gate electrodes extending in a second direction substantially parallel to the upper surface of the substrate;
   a channel extending in the first direction through the gate electrode structure;
   an insulation pattern structure extending through the gate electrode structure;
   an etch stop structure extending through the gate electrode structure and surrounding at least a portion of a sidewall of the insulation pattern structure, the etch stop structure including a filling pattern and an etch stop pattern on a sidewall of the filling pattern;
   a through via extending in the first direction through the insulation pattern structure;
   a first division pattern at each of opposite sides of the gate electrode structure in a third direction substantially parallel to the upper surface of the substrate and crossing the second direction, each of the first division pattern extending in the second direction; and
   second division patterns spaced apart from each other in the second direction between the first division patterns, each of the second division patterns extending through the gate electrode structure,
   wherein an upper surface of each of the first and second division patterns is higher than an upper surface of the etch stop structure.

2. The vertical memory device as claimed in claim 1, wherein the filling pattern includes a nitride, polysilicon or an oxide, and the etch stop pattern includes an oxide.

3. The vertical memory device as claimed in claim 1, wherein the etch stop structure further includes a spacer between the filling pattern and the etch stop pattern.

4. The vertical memory device as claimed in claim 3, wherein the filling pattern includes polysilicon or an oxide, and the spacer includes a nitride.

5. The vertical memory device as claimed in claim 1, wherein the etch stop structure has a closed ring shape in a plan view.

6. The vertical memory device as claimed in claim 1, wherein the etch stop structure includes:
   first parts spaced apart from each other in the third direction substantially parallel to the upper surface of the substrate and crossing the second direction, each of the first parts extending in the second direction; and
   second parts spaced apart from each other in the second direction, each of the second parts extending in the third direction.

7. The vertical memory device as claimed in claim 6, wherein the first and second parts of the etch stop structure contact each other so that the etch stop structure has a rectangular ring shape in a plan view.

8. The vertical memory device as claimed in claim 1, wherein the etch stop structure includes a void therein.

9. The vertical memory device as claimed in claim 1, further comprising first insulation patterns between the gate electrodes spaced apart from each other in the first direction.

10. The vertical memory device as claimed in claim 9, wherein the insulation pattern structure includes second and third insulation patterns alternately and repeatedly stacked in the first direction, and
    wherein each of the second insulation patterns includes a nitride, and each of the third insulation patterns includes an oxide.

11. The vertical memory device as claimed in claim 10, wherein the third insulation patterns are at the same levels as corresponding ones of the first insulation patterns, respectively.

12. The vertical memory device as claimed in claim 1, further comprising an insulation pattern covering a sidewall of the through via.

13. A vertical memory device comprising:
    a gate electrode structure including gate electrodes spaced apart from each other on a substrate in a first direction substantially perpendicular to an upper surface of the substrate, each of the gate electrodes extending in a second direction substantially parallel to the upper surface of the substrate;
    a channel extending in the first direction through the gate electrode structure;
    an etch stop structure extending in the first direction through the gate electrode structure, the etch stop structure having a closed ring shape in a plan view and including a plurality of patterns containing different materials from each other;
    an insulation pattern structure surrounded by the etch stop structure;
    a through via extending in the first direction through the insulation pattern structure;

a first division pattern at each of opposite sides of the gate electrode structure in a third direction substantially parallel to the upper surface of the substrate and crossing the second direction, each of the first division pattern extending in the second direction; and second division patterns spaced apart from each other in the second direction between the first division patterns, each of the second division patterns extending through the gate electrode structure, wherein an upper surface of each of the first and second division patterns is higher than an upper surface of the etch stop structure.

14. The vertical memory device as claimed in claim 13, wherein the etch stop structure includes:

a first pattern extending in the first direction and having the closed ring shape in plan view, the first pattern including a nitride, polysilicon or an oxide; and a second pattern covering a sidewall and a bottom of the first pattern, the second pattern including an oxide.

15. The vertical memory device as claimed in claim 14, wherein the first pattern includes polysilicon or an oxide, and wherein the etch stop structure further includes a third pattern between the first and second patterns.

16. A vertical memory device comprising:

a gate electrode structure including gate electrodes spaced apart from each other on a substrate in a first direction substantially perpendicular to an upper surface of the substrate, each of the gate electrodes extending in a second direction substantially parallel to the upper surface of the substrate;

a channel extending in the first direction through the gate electrode structure;

an insulation pattern structure extending through the gate electrode structure;

an etch stop structure extending through the gate electrode structure and surrounding at least a portion of a sidewall of the insulation pattern structure;

a through via extending in the first direction through the insulation pattern structure;

a first division pattern at each of opposite sides of the gate electrode structure in a third direction substantially parallel to the upper surface of the substrate and crossing the second direction, each of the first division pattern extending in the second direction;

second division patterns spaced apart from each other in the second direction between the first division patterns, each of the second division patterns extending through the gate electrode structure; and a support layer covering an upper surface of the etch stop structure and contacting an upper sidewall of each of the first and second division patterns, wherein each of the first division patterns is spaced apart from the etch stop structure in the third direction, and each of the second division patterns is spaced apart from the etch stop structure in the second direction, and wherein an upper surface of each of the first and second division patterns is higher than an upper surface of the etch stop structure.

17. The vertical memory device as claimed in claim 16, wherein a distance between the first division pattern and the etch stop structure is equal to or less than half a distance between neighboring ones of the first and second division patterns in the second direction.

18. The vertical memory device as claimed in claim 16, wherein the etch stop structure includes:

a first pattern including a nitride, polysilicon or an oxide, the first pattern extending in the first direction; and a second pattern including an oxide, the second pattern covering a sidewall and a bottom of the first pattern.

* * * * *